(12) United States Patent
Akkaya et al.

(10) Patent No.: US 12,260,928 B2
(45) Date of Patent: Mar. 25, 2025

(54) MEMORY DEVICES WITH BACKSIDE BOOST CAPACITOR AND METHODS FOR FORMING THE SAME

(71) Applicant: Taiwan Semiconductor Manufacturing Company, Ltd., Hsinchu (TW)

(72) Inventors: Nail Etkin Can Akkaya, Hsinchu (TW); Mahmut Sinangil, Campbell, CA (US); Yih Wang, Hsinchu (TW); Jonathan Tsung-Yung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 261 days.

(21) Appl. No.: 17/835,652

(22) Filed: Jun. 8, 2022

(65) Prior Publication Data
US 2023/0274769 A1    Aug. 31, 2023

Related U.S. Application Data

(60) Provisional application No. 63/314,351, filed on Feb. 25, 2022.

(51) Int. Cl.
*G11C 5/14*    (2006.01)
*G11C 7/12*    (2006.01)
(Continued)

(52) U.S. Cl.
CPC ............... *G11C 5/145* (2013.01); *G11C 7/12* (2013.01); *G11C 11/419* (2013.01); *H10B 10/18* (2023.02)

(58) Field of Classification Search
CPC ......... G11C 5/145; G11C 7/12; G11C 11/419; G11C 11/412; G11C 11/41; G11C 11/413; H10B 10/18; H10B 10/12
See application file for complete search history.

(56) References Cited

U.S. PATENT DOCUMENTS 10,229,731 B1 *  3/2019  Goel .................... G11C 11/419
2004/0238868 A1  12/2004  Arnold et al.
(Continued)

FOREIGN PATENT DOCUMENTS

KR    10-2020-0050418 A    5/2020
KR       20200050418 A     5/2020
(Continued)

OTHER PUBLICATIONS

Office Action issued in connection with Taiwan Appl. No. 111147406 dated Oct. 31, 2023.
(Continued)

*Primary Examiner* — Donald H B Braswell
(74) *Attorney, Agent, or Firm* — FOLEY & LARDNER LLP

(57) ABSTRACT

A device includes a memory array formed on a front side of a substrate. The memory array is accessible through a plurality of bit lines. The memory device includes a switch transistor formed on the front side of the substrate. The switch transistor is operatively coupled to the plurality of bit lines. The memory device includes a first capacitor formed on a back side of the substrate. The first capacitor is configured to reduce a voltage level present on at least one of the plurality of bit lines, in response to the switch transistor being turned off.

20 Claims, 24 Drawing Sheets

(51) Int. Cl.
*G11C 11/419* (2006.01)
*H10B 10/00* (2023.01)

(56) References Cited

U.S. PATENT DOCUMENTS

| | | |
|---|---|---|
| 2004/0238869 A1 | 12/2004 | Chang et al. |
| 2005/0255387 A1 | 11/2005 | Butt et al. |
| 2012/0217549 A1 | 8/2012 | Widjaja |
| 2019/0164581 A1* | 5/2019 | Nguyen .................. G11C 8/08 |
| 2020/0135269 A1 | 4/2020 | Hsieh et al. |
| 2020/0373312 A1* | 11/2020 | Sharma ................ G11C 11/223 |
| 2021/0375926 A1 | 12/2021 | Mehandru et al. |
| 2022/0358997 A1* | 11/2022 | She ..................... G11C 11/4076 |
| 2023/0180482 A1* | 6/2023 | Gomes .................. H10B 53/20 |
| | | 257/295 |

FOREIGN PATENT DOCUMENTS

| | | |
|---|---|---|
| KR | 10-2021-0139121 A | 11/2021 |
| KR | 20210139121 A | 11/2021 |

OTHER PUBLICATIONS

Office Action issued in connection with Korean Appl. No. 10-2022-0096607 dated Mar. 18, 2024.
Office Action issued in connection with Taiwan Appl. No. 111147406 dated Apr. 25, 2024.
Office Action issued in connection with German Appl. No. 102023101122.7 dated Jun. 26, 2024.

* cited by examiner

MEMORY DEVICES WITH BACKSIDE BOOST CAPACITOR AND METHODS FOR FORMING THE SAME

CROSS-REFERENCE TO RELATED APPLICATION

This application claims priority to and the benefit of U.S. Provisional Application No. 63/314,351, filed Feb. 25, 2022, entitled "NEGATIVE BIT LINE (BL) WITH INTEGRATED METAL-OXIDE-METAL (MOM) CAPACITORS," which is incorporated herein by reference in its entirety for all purposes.

BACKGROUND

Static random access memory (SRAM) is a type of semiconductor memory used in computing applications that require, for example, high-speed data access. For example, cache memory applications use SRAMs to store frequently-accessed data, e.g., data accessed by a central processing unit.

The SRAM's cell structure and architecture enable high-speed data access. The SRAM cell includes a bi-stable flip-flop structure including, for example, four to eight transistors. An SRAM architecture can include one or more arrays of memory cells and support circuitry. Each of the SRAM arrays is arranged in rows and columns called "word lines" and "bit lines," respectively. The support circuitry includes address and driver circuits to access each of the SRAM cells via the word lines and bit lines for various SRAM operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
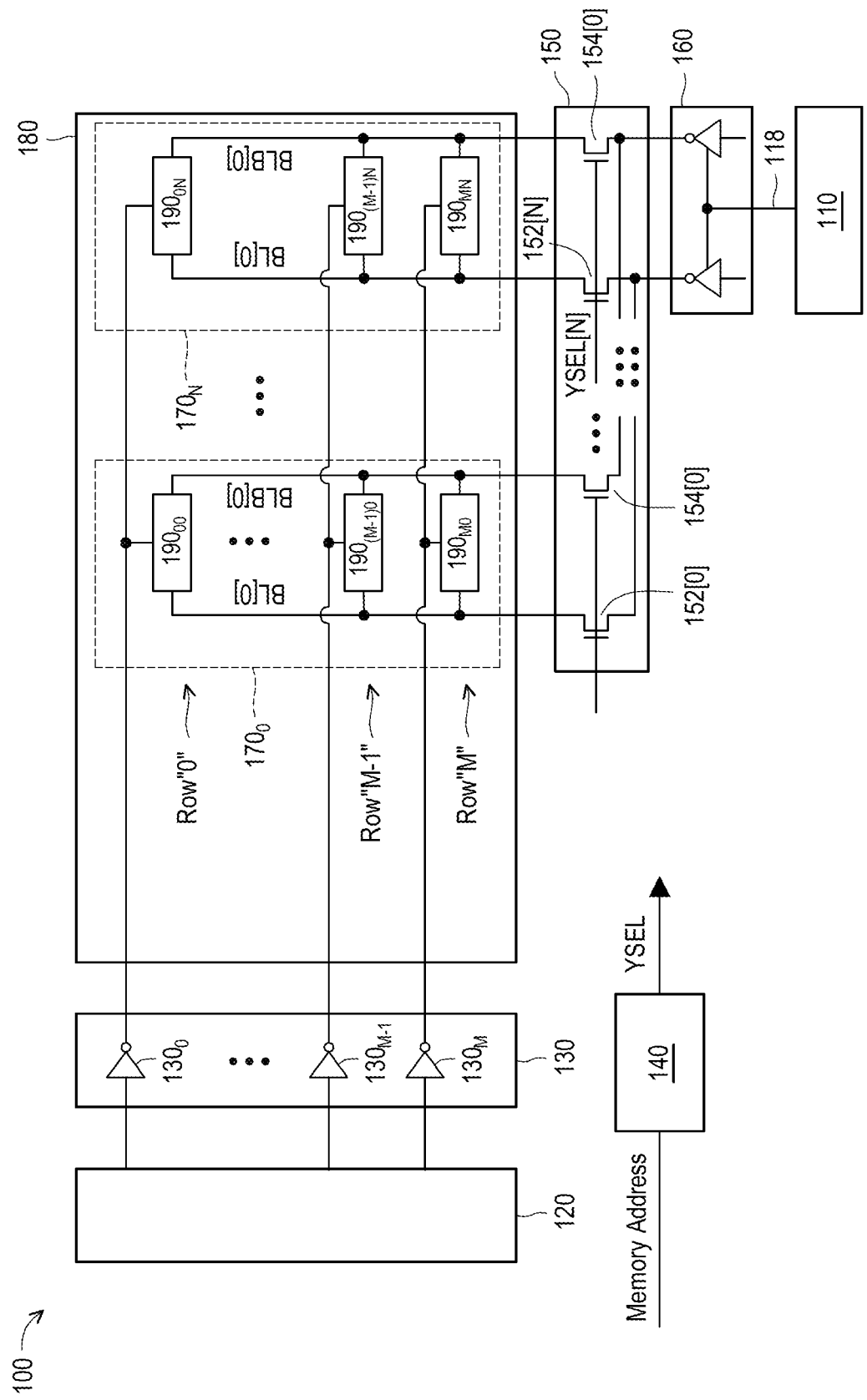
FIG. 1 illustrates a schematic view of a memory device including a write assist circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following disclosure describes various aspects of a memory device, e.g., a static random access memory (SRAM) device. Specifically, the disclosure describes different embodiments related to an SRAM memory write operation. For ease of explanation, certain SRAM circuit elements and control logic are disclosed to facilitate in the description of the different embodiments. It should be appreciated that SRAM devices also include other circuit elements and control logic. These other circuit elements and control logic are within the spirit and scope of this present disclosure.

A typical SRAM device includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor (6T) cell, a pair of access transistors or pass gates (when activated by a word line) selectively couples the inverters to a pair of complementary bit lines. Other SRAM cell designs may include a different number of transistors, e.g., 4T, 8T, etc.

The design of SRAM cells has traditionally involved a compromise between the read and write functions of the memory cell to maintain cell stability, read performance and write performance. The transistors which make up the cross-coupled latch must be weak enough to be overdriven during a write operation, while also strong enough to maintain their data value when driving a bit line during a read operation. The access transistors that connect the cross-coupled cell nodes to the true and complement bit lines affect both the stability and performance of the cell. In one-port SRAM cells, a single pair of access transistors is conventionally used for both read and write access to the cell. The gates are driven to a digital value in order to switch the transistors between an on state and off state. The optimization of an access for a write operation would drive the reduction of the on-resistance (Ron) for the device. On the other hand, the optimization of an access transistor for a read operation drives an increase in Ron in order to isolate the cell from the bit line capacitance and prevent a cell disturb.

One recently proposed approach to improving write performance of SRAM devices is to use so-called "negative boosting" to discharge a bit line to a voltage level below the nominal low supply rail value (e.g., ground). Alternatively stated, the corresponding bit line of an SRAM cell may present a negative voltage, when being written. Such a bit line is typically discharged to the negative voltage through a capacitor, or sometimes referred to as a boost capacitor. In this way, the pass gates of the SRAM cell coupled to the discharged bit line see a resultant increase in both the gate-to-source and drain-to-source voltages. This negative boosting may allow for an increased margin of 30 or more (in terms of expected device failures) as compared to more conventional write techniques, wherein the bit line is simply discharged to the value of the nominal low voltage rail (e.g., ground).

However, notwithstanding the benefits of negative boosting, the existing SRAM devices with negative boosting may still not be entirely satisfactory in many aspects. For example, the boost capacitor is typically formed as a metal-insulator-metal (MIM) or metal-oxide-metal (MOM) structure. Such a capacitor structure is typically disposed in one or more metallization layers on the frontside of a substrate where a number of active devices (e.g., the corresponding transistors of SRAM cells) are formed. With the ever progressively shrunk size of transistors in advanced technology nodes, a size of the boost capacitor may be forced to shrink accordingly, which can disadvantageously reduce a capacitive value of the boost capacitance. On the other hand, keeping the size of the boost capacitor significantly consumes precious real estate of the frontside metallization layers, which can be utilized for forming other routing signals.

The present disclosure provides various embodiment of an SRAM device with a negative voltage generator that includes one or more components formed on the backside of a substrate, which is opposite to a frontside of the substrate where corresponding SRAM cells are formed. In various embodiments, the negative voltage generator, as disclosed herein, can generate a negative voltage to a number of bit lines coupled to the SRAM cells, when writing those SRAM cells. The negative voltage generator may include at least one boost capacitor that has at least a majority portion formed on the backside of the substrate. For example, the boost capacitor can be formed by connecting a number of sub-capacitors in parallel. Respective (positive and negative) terminals of one or more of the sub-capacitors are formed as conductive lines on the backside of the substrate. Forming at least a portion of the boost capacitor on the backside can offer various advantages for the SRAM device as a whole. For example, with the backside conductive lines functioning as the boost capacitor, a significant amount of the frontside real estate (e.g., conductive lines) can be saved for other usage or application. In another example, the backside conductive lines can be formed with a higher thickness than the frontside conductive lines, which essentially increases the surface area of conductor plates of the boost capacitor. As such, within the same layout area, the boost capacitor, as disclosed herein, can be characterized with a higher capacitive value (e.g., about 16~25% more), when compared to the conventional boost capacitor that is only formed on the frontside.

FIG. 1 illustrate a schematic view of an example static random access memory (SRAM) device/circuit 100 with a write assist circuit 110 that includes a boost capacitor, according to various embodiments of the present disclosure. The SRAM device 100 includes a row decoder 120, a word line driver 130, a column decoder 140, a column multiplexer (MUX) 150, a write driver circuit 160, and an SRAM array 180.

The SRAM array 180 includes a number of memory cells 190. The memory cells 190 can be arranged in one or more arrays in the SRAM device 100. In the illustrated example of FIG. 1, a single SRAM array 180 is shown to simplify the description of the disclosed embodiments. The SRAM array 180 has "M+1" number of rows and "N+1" number of columns. For example, the SRAM array 180 includes the memory cells 190 arranged over rows, $row_0$ to $row_M$, and columns $170_0$ to $170_N$. Accordingly, the notation "$190_{00}$" refers to one of the memory cells 190 located in $row_0$ and column $170_0$. Similarly, the notation "$190_{MN}$" refers to another one of the memory cells 190 located in $row_M$ and column $170_N$.

Each of the SRAM cells in the SRAM array 180 is accessed, e.g., for memory read and memory write operations, using a memory address. Based on a portion of the memory address, the row decoder 120 selects a row (e.g., one of the $row_0$ to $row_M$) of the memory cells to access via the word line driver 130 (e.g., a corresponding one of a number of word line drivers $130_0$ ... $130_M$). Also, based on the memory address, the column decoder 140 selects a column of memory cells $170_0$-$170_N$ to access via the write assist circuit 110 and the column MUX 150, according to some embodiments of the present disclosure. Based on another portion of the memory address, the column decoder 140 outputs a corresponding YSEL signal to activate a corresponding pair of y-select transistors, 152 and 154, in the column MUX 150 to access a corresponding column. Each column includes a bit line pair, BL and BLB. The notation "BL" refers to a bit line, and the notation "BLB" refers to the complement of "BL." For example, to access the memory cells in the column $170_0$, the column decoder 140 outputs YSEL[0] signal to active the pair of transistors 152[0] and 154[0] corresponding to the column $170_0$ so as to allow access the corresponding pair of bit line BL[0] and bit line bar BLB[0]. In another example, to access the memory cells in the column $170_N$, the column decoder 140 outputs YSEL[N] signal to active the pair of transistors 152[N] and 154[N] corresponding to the column $170_N$ so as to allow access the corresponding pair of bit line BL[N] and bit line bar BLB[N]. In some embodiments, the write driver circuit 160 generates voltages for the bit line pair of BL and BLB in the accessed one of columns $170_0$ to $170_N$. As such, the intersection of the accessed row and the accessed column of memory cells results in access to a single memory cell 190.

Figure 2:
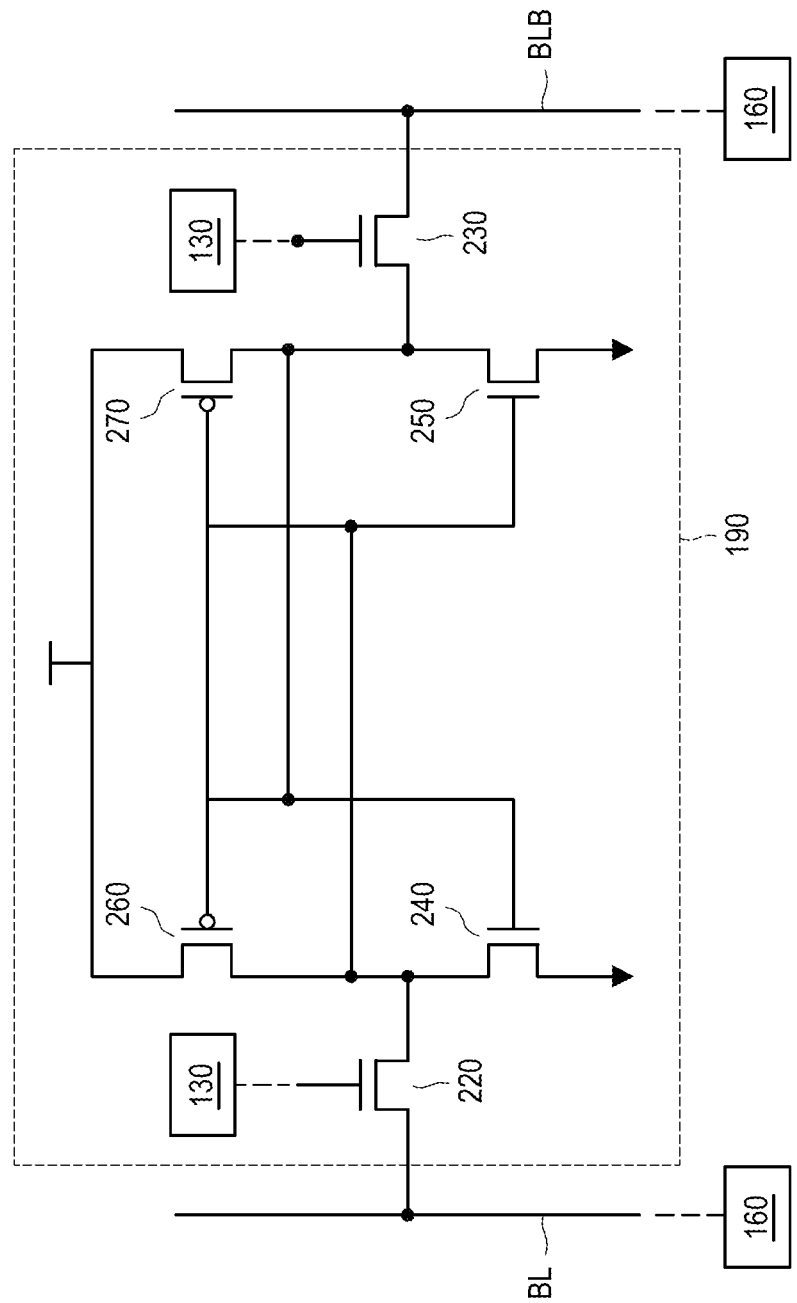
FIG. 2 illustrates a schematic view of one of the memory cells of the memory device of FIG. 1, in accordance with some embodiments.

The memory cell 190 can have any of various circuit topologies. For example, the memory cell 190 can have a "6T" circuit topology. FIG. 2 illustrates an example 6T circuit topology for the memory cell 190. The 6T circuit topology includes n-channel metal-oxide-semiconductor (NMOS) pass devices 220 and 230, NMOS pull-down devices 240 and 250, and p-channel metal-oxide-semiconductor (PMOS) pull-up devices 260 and 270. A voltage from the word line driver 130 controls the NMOS devices 220 and 230 to pass voltages from the bit line pair of BL and BLB to a bi-stable flip-flop structure formed by the NMOS devices 240 and 250 and the PMOS devices 260 and 270. The bit line pair of BL and BLB voltages can be used during a memory write operation. For example, if bit line BL is at a '1' or a logic high value (e.g., a power supply voltage VDD such as 0.4V, 0.6V, 0.7V, 1.0V, 1.2V, 1.8V, 2.4V, 3.3V, 5V, or any combination thereof) and bit line BLB is at a '0' or a logic low value (e.g., ground or 0V), the voltage applied by the word line driver 130 to the gate terminals of the NMOS pass devices 220 and 230 can be at a sufficient voltage level to pass the bit line BL's logic high value and the bit line bar BLB's logic low value to the bi-stable flip-flop structure. As a result, these logic values are written (or programmed) into the bi-stable flip-flop structure.

Figure 3:
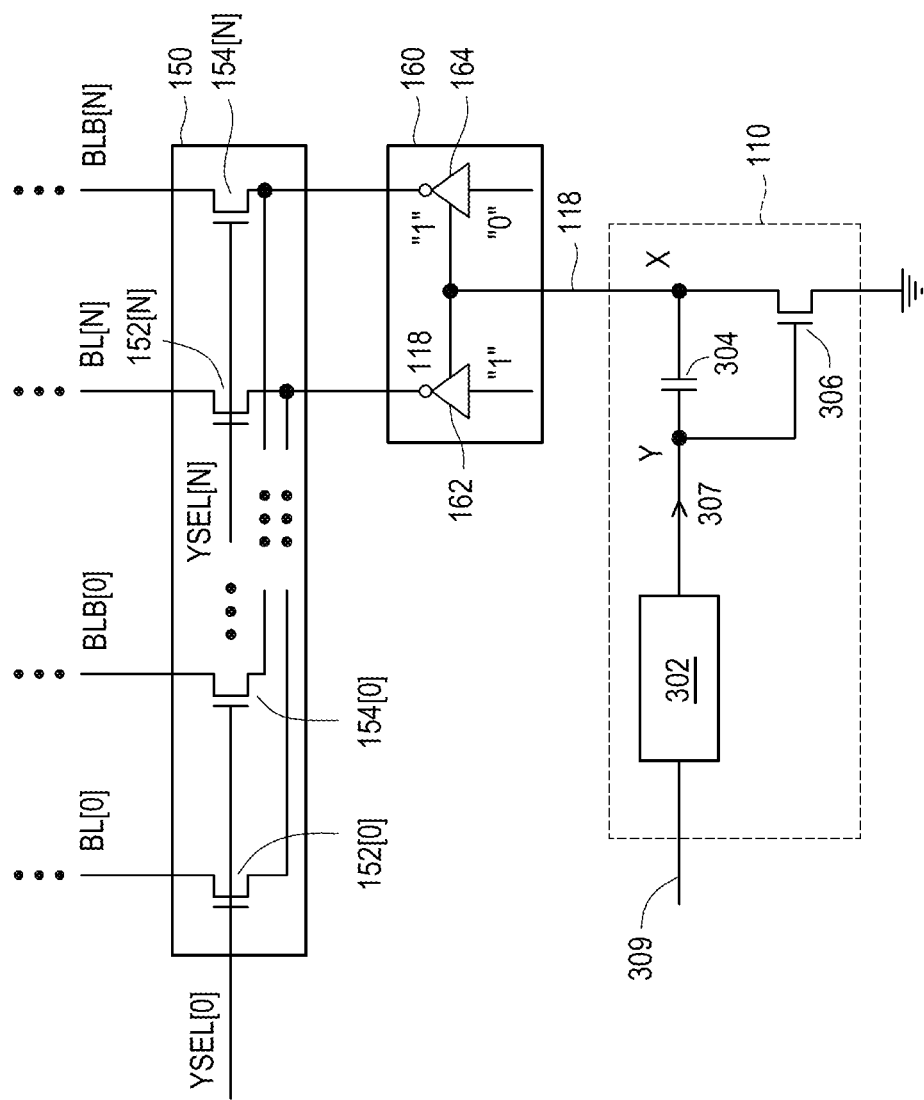
FIG. 3 illustrates a schematic view of the write assist circuit of the memory device of FIG. 1, in accordance with some embodiments.

FIG. 3 illustrates a schematic diagram of an example of the write assist circuit 110, in accordance with various embodiments of the present disclosure. The write assist circuit 110 is configured to provide a reference voltage 118 to the write driver circuit 160 as a reference voltage. The reference voltage 118 can be ground (e.g., 0V), a negative voltage (e.g., −100 mV, −200 mV, or −300 mV), or a combination thereof, according to some embodiments of the present disclosure. The write assist circuit 110 includes one or more boost capacitors configured to provide such a negative reference voltage 118, which will be discussed as follows.

In some embodiments, the write driver circuit 160 includes level-shifter devices 162 and 164 that each receive the reference voltage 118. With a logic low input received by either the level-shifter device 162 or 164, the corresponding level-shifter device outputs a logic high value (e.g., a power supply voltage VDD of the inverter logic device such as 0.4V, 0.6V, 0.7V, 1.0V, 1.2V, 1.8V, 2.4V, 3.3V, 5V, or any combination thereof). Conversely, with a logic high input received by either the level-shifter device 162 or 164, the corresponding level-shifter device outputs the reference voltage 118. For example in FIG. 3, the level-shifter device 162 receives a logic high value and the level-shifter device 164 receives a logic low value, and thus, the level-shifter device 162 outputs the reference voltage 118 to the BL of an accessed column (e.g., asserted by the YSEL signal) and the level shifter device 164 outputs a logic high value to the BLB of the same access column.

The write assist circuit 110 is coupled to the write driver circuit 160 at Node X. The write assist circuit 110 includes a NMOS switch transistor 306 coupled between ground and Node X and a boost capacitor 304 directly coupled between the drain (Node X) and gate terminals (Node Y) of the transistor 306. In some embodiments, the switch transistor 306 and boost capacitor 304 can provide a negative voltage to a coupled bit line. The switch transistor 306 and boost capacitor 304 are sometimes collectively referred to as a (negative) voltage generator. A bit line boost enable control signal 307 is provided at Node Y from a logic circuit 302, which is responsive to a write enable signal 309. The logic circuit 302 may include a number of delay elements connected in series with one or more inverters that provide a delay to the write enable signal 309. The write enable signal 309 can thus be delayed and inverted to provide the boost signal 307 at node Y. Before the write enable signal 309 goes high (at the start of the write operation/period), the boost signal 307 is high, which turns the transistor 306 on and charges the boost capacitor 304. When the boost signal 307 is high, Node X is also connected to ground through the transistor 306. After the delay, the boost signal 307 goes low, which turns off the transistor 306 and, at the same time, causes a discharge from the boost capacitor 304, which drives Node X (i.e., the reference voltage 118) from ground (low) to a negative value. This negative reference voltage 118 is then provided to bit lines (BL/BLB) through the write driver circuit 160 (as discussed above), which provides a boost for the write operation performed to the SRAM cell 190 coupled to the bit lines (BL/BLB).

Figure 4:
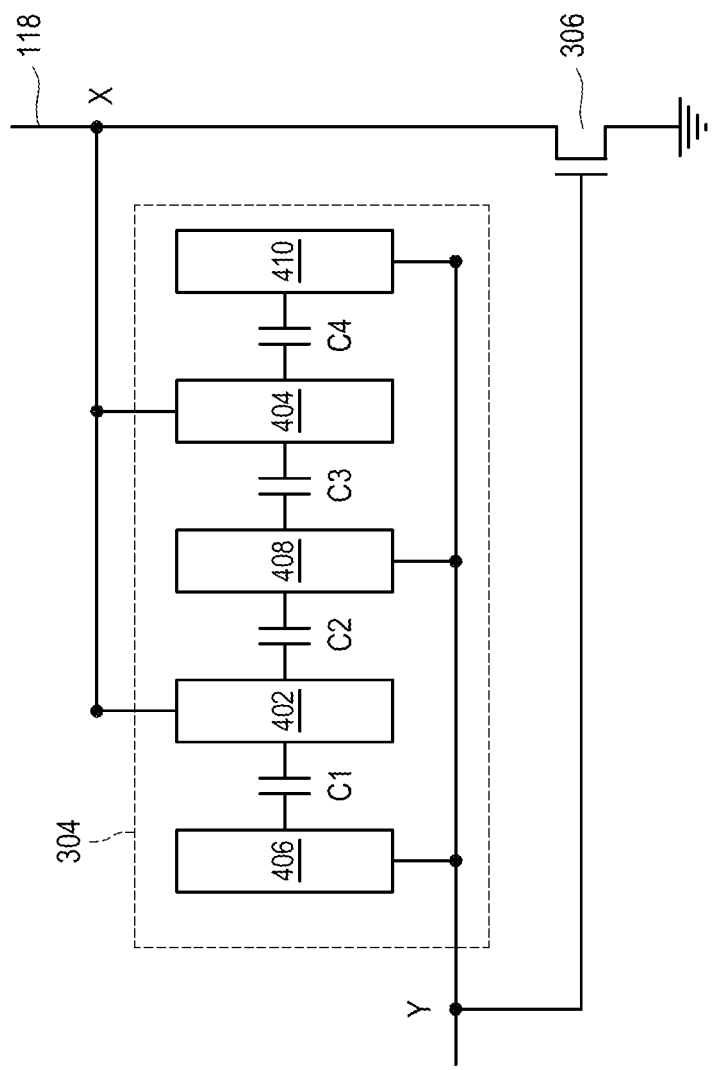
FIG. 4 illustrates a schematic view of a boost capacitor of the write assist circuit of FIG. 3, in accordance with some embodiments.

FIG. 4 illustrates a schematic view of the boost capacitor 304 connected between node X and node Y, in accordance with various embodiments. Specifically, the boost capacitor 304 has a first terminal connected to node X and a second terminal connected to node Y. In accordance with various embodiments, the boost capacitor 304 has a number of sub-capacitors (or capacitors) connected in parallel. Each of the sub-capacitors has a respective pair of terminals sandwiching a dielectric material therebetween. In some embodiments, a capacitive value of the boost capacitor may be positively proportional to a number of the sub-capacitors connected in parallel.

For example in FIG. 4, the boost capacitor 304 has sub-capacitors, $C_1$, $C_2$, $C_3$, and $C_4$ connected in parallel, which are, at least in part, implemented as a number of first metal lines 402 and 404 and a number of second metal lines 406, 408, and 410. The first metal lines 402-404 are connected to Node X functioning as the first terminal of the boost capacitor 304, and the second metal lines 406-410 are connected to Node Y functioning as the second terminal of the boost capacitor 304. Specifically, the sub-capacitor $C_1$ has the first metal line 402 and second metal line 406 as its corresponding terminals (or sub-terminals); the sub-capacitor $C_2$ has the first metal line 402 and second metal line 408 as its corresponding terminals (or sub-terminals); the sub-capacitor $C_3$ has the first metal line 404 and second metal line 408 as its corresponding terminals (or sub-terminals); and the sub-capacitor $C_4$ has the first metal line 404 and second metal line 410 as its corresponding terminals (or sub-terminals). Although the boost capacitor 304 is formed by two first metal lines and three second metal lines (e.g., as four parallel connected sub-capacitors), it should be understood that the boost capacitor 304 can be formed by any number of the first metal lines and any number of the second metal lines (as any number of parallel connected sub-capacitors), while remaining within the scope of the present disclosure.

Figure 5:
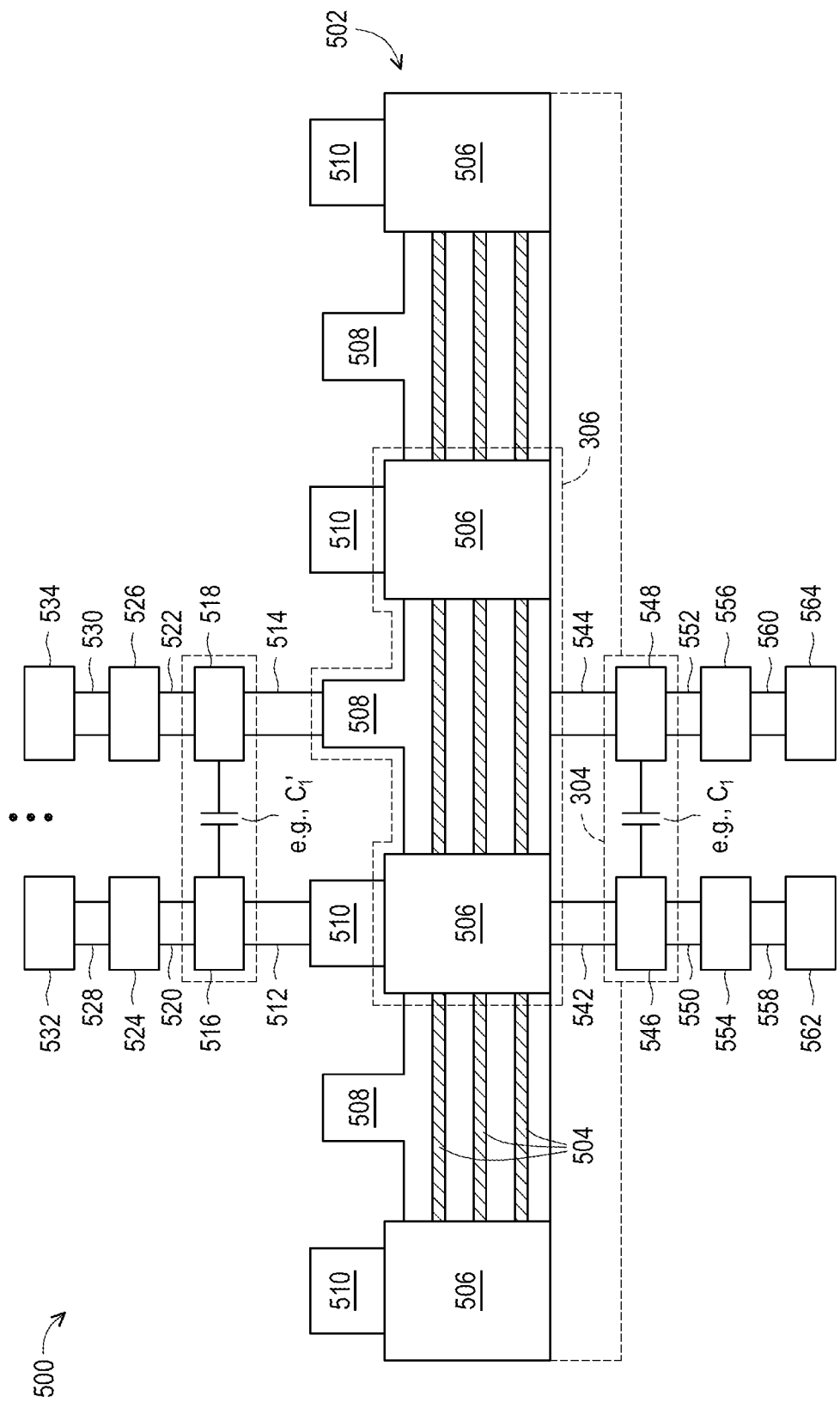
FIG. 5 illustrates a cross-sectional view of an example semiconductor device, which may be a portion of an implementation of the memory device of FIG. 1, in accordance with some embodiments.

FIG. 5 illustrates a cross-sectional view of a semiconductor device 500 that may be implemented as at least a portion of the SRAM device 100, e.g., the write assist circuit 110. The cross-sectional view of FIG. 5 is cut along the lengthwise direction of channels of a plurality of transistors of the semiconductor device 500, which are each implemented as a gate-all-around field-effect-transistor (GAA FET) device. However, it should be understood that the transistors of the semiconductor device 500 may be implemented as any of various other transistor structures (e.g., FinFETs, planar FETs, or otherwise nanostructure transistors, etc.), while remaining within the scope of the present disclosure. Additionally, FIG. 5 is simplified to illustrate relatively spatial configurations of the above-discussed components (e.g., the boost capacitor 304, the switch transistor 306), and thus, it should be understood that one or more features/structures of a completed GAA FET device may not be shown in FIG. 5.

On the frontside of a substrate (which is enclosed by a dotted line, as it has been removed when forming backside interconnect structures), the semiconductor device 500 includes an active region 502 having portions being formed as channels 504 and portions being formed as source/drain structures 506. The channels 504 each include one or more nanostructures (e.g., nanosheets, nanowires) vertically spaced apart from each other, in various embodiments. The semiconductor device 500 includes a number of (e.g., metal) gate structures 508, each on which wraps around the nanostructures of a corresponding channel 504.

Over the source/drain structure 506, the semiconductor device 500 includes a number of source/drain interconnect structures (sometimes referred to as MDs) 510, some of which are coupled with drain via structures (sometimes referred to as VDs) 512 formed thereupon. Over the gate structure 508, the semiconductor device 500 includes a number of gate via structures (sometimes referred to as VGs) 514.

The VD 512 can couple the MD 510 to a first metal line in the first (e.g., bottommost) frontside metallization layer (sometimes referred to as an M0 track) 516. The VG 514 can couple the gate structure 508 to a second M0 track 518. Over the M0 tracks 516 and 518 (and various other metal lines in the bottommost frontside metallization layer), the semiconductor device 500 includes a number of via structures (sometimes referred to as V0s), 520 and 522, to couple the M0 tracks 516 and 518 to respective metal lines in the next frontside metallization layer farther away from the substrate (sometimes referred to as M1 tracks), 524 and 526. Further, over the M1 tracks 524 and 526 (and various other metal lines in the same frontside metallization layer), the semiconductor device 500 includes a number of via structures (sometimes referred to as V1s), 528 and 530, to couple the M1 tracks 524 and 526 to respective metal lines in the next frontside metallization layer farther away from the substrate (sometimes referred to as M2 tracks), 532 and 534. Although three frontside metallization layers are shown, it should be understood that the semiconductor device 500 can include any number of frontside metallization layers. The metal tracks formed across such frontside metallization layers can be configured to electrically couple different components of the SRAM device 100 (so as to route signals and/or deliver power), in accordance with various embodiments.

On the backside of the substrate, the semiconductor device 500 includes a number of backside via structures (sometimes referred to as BVs), 542 and 544, that can couple the source/drain structure 506 and gate structure 508 to a number of metal lines in the first (e.g., bottommost) backside metallization layer (sometimes referred to as BM0 tracks), 546 and 548, respectively. Further, over the BM0 tracks 546 and 548, the semiconductor device 500 includes a number of via structures (sometimes referred to as BV0s), 550 and 552, that can couple the BM0 tracks 546 and 548 to a number of metal lines in the next backside metallization layer farther away from the substrate (sometimes referred to as BM1 tracks), 554 and 556, respectively. Still further, over the BM1 tracks 554 and 556, the semiconductor device 500 includes a number of via structures (sometimes referred to as BV1s), 558 and 560, that can couple the BM1 tracks 554 and 556 to a number of metal lines in the next backside metallization layer farther away from the substrate (sometimes referred to as BM2 tracks), 562 and 564, respectively.

In accordance with various embodiments of the present disclosure, at least one of the channels 504, together with a corresponding one of the gate structures 508 wrapping around such a channel and with a corresponding pair of source/drain structures 506, can form the switch transistor 306 of the write assist circuit 110. Further, at least one pair of the backside metal lines can form at least a portion of the boost capacitor 304 of the write assist circuit 110. For example in FIG. 5, the BM0 track 546 coupled to one of the source/drain structures 506 of the switch transistor 306 can serve as a first terminal of the boost capacitor 304's sub-capacitor (or capacitor) $C_1$, and the BM0 track 548 coupled to the other of the source/drain structures 506 of the switch transistor 306 can serve as a second terminal of the boost capacitor 304's sub-capacitor (or capacitor) $C_1$. Referring again to the schematic view of FIG. 4, the BM0 tracks 546 and 548 of FIG. 5 can correspond to the metal lines 402 and 406 of FIG. 4, respectively.

Figure 6:
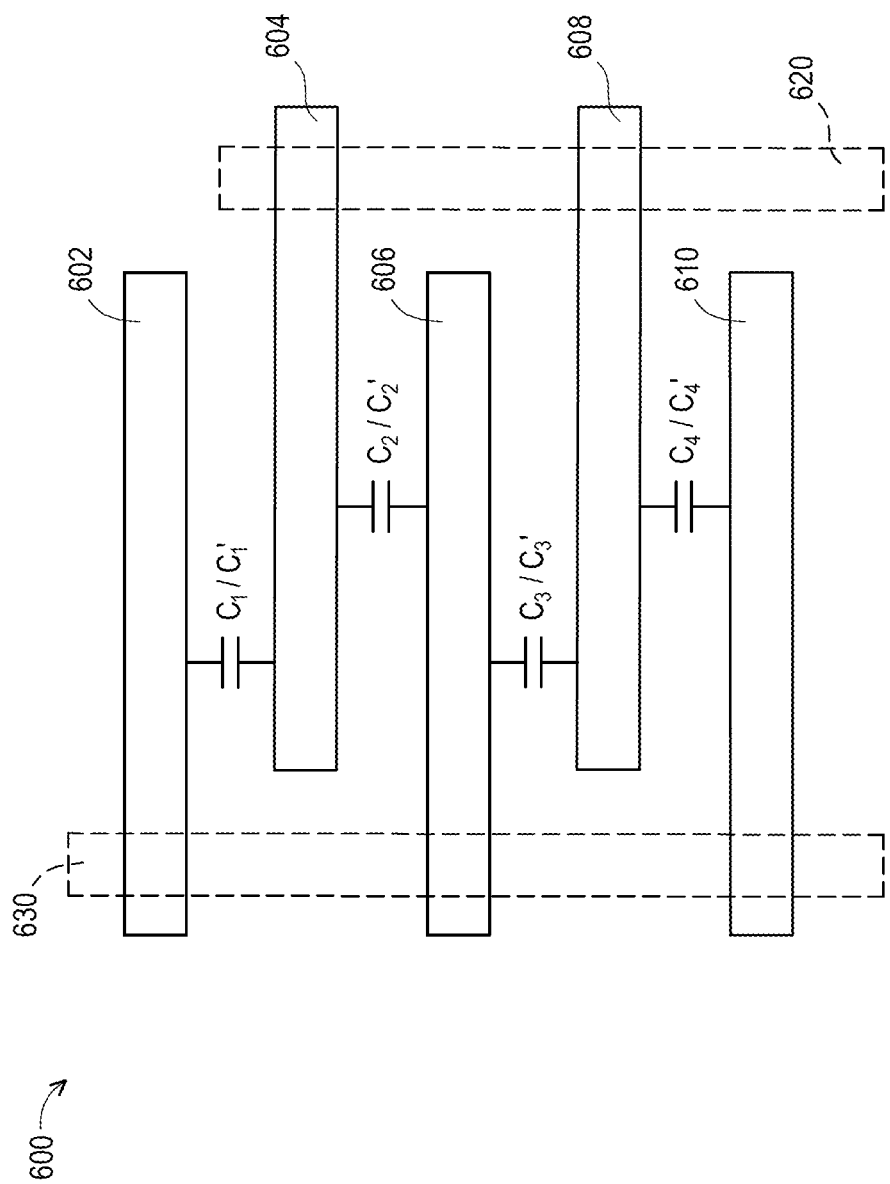
FIG. 6 illustrates an example layout for forming the boost capacitor of FIG. 4, in accordance with some embodiments.

It should be understood that other sub-capacitors of the boost capacitor 304 can be formed by other BM0 tracks, i.e., other metal lines in the bottommost backside metallization layer. For example, FIG. 6 illustrates a portion of a layout 600 that includes a number of patterns 602, 604, 606, 608, and 610 configured to form the respective BM0 tracks that constitute the boost capacitor. As shown, the patterns 604 and 608, configured to form the metal lines (e.g., embodied as BM0 tracks) 402 and 404 (FIG. 4), respectively, may have their ends aligned with each other. Hereinafter, the patterns 604 and 608 are referred to as BM0 tracks 604 and 608, respectively. The patterns 602, 606, and 610, configured to form the metal lines (e.g., embodied as BM0 tracks) 406, 408, and 410 (FIG. 4), respectively, may have their ends aligned with each other. Hereinafter, the patterns 602, 606, and 610 are referred to as BM0 tracks 602, 606, and 610, respectively. As such, the sub-capacitors $C_1$, $C_2$, $C_3$, and $C_4$ of the boost capacitor 304 can be formed by the combinations of BM0 tracks 602 and 604, BM0 tracks 604 and 606, BM0 tracks 606 and 608, and BM0 tracks 608 and 610, respectively.

Further, the patterns 604 and 608 are laterally shifted from the patterns 602, 606, and 610 with a certain offset, allowing the BM0 tracks 604 and 608 to be electrically coupled to each other through one or more interconnect structures (e.g., a pattern 620 configured to form an MD/M1 track 620), and the BM0 tracks 602, 606, and 610 to be electrically coupled to each other through one or more interconnect structures (e.g., a pattern 630 configured to form an MD/M1 track 630). The MD/M1 track 620 may be operatively connected to Node X (e.g., the drain of the switch transistor 306), and the MD/M1 track 630 may be operatively connected to Node Y (e.g., the gate of the switch transistor 306).

It should also be understood that the patterns of the layout 600 are not limited to forming BM0 tracks that constitute the boost capacitor 304. The patterns 602 to 610 can also be utilized to form a number of other metal lines on the frontside and/or the backside. For example, the patterns 602 to 610 can be used to form a number of BM2 tracks (e.g., 562, 564 of FIG. 5) constituting at least a portion of the boost capacitor 304. In another example, in addition to the BM0 and/or BM2 tracks constituting the boost capacitor 304, the patterns 602 to 610 can be used to form a number of M0 tracks (e.g., 516, 518 of FIG. 5) and/or M2 tracks (e.g., 532, 534 of FIG. 5) constituting at least a portion of the boost capacitor 304.

Referring again to FIG. 5, the M0 tracks 516 and 518 can form one of a number of parallel connected sub-capacitors, $C_1'$, to further increase the capacitive value of the boost capacitor 304. The M0 tracks 516 and 518, formed based on the patterns 602 and 604 of the layout 600, respectively, may function as terminals of the sub-capacitors, $C_1'$. Further, other M0 tracks, formed based on the patterns 604 and 606 of the layout 600, respectively, may function as terminals of another sub-capacitors, $C_2'$; yet other M0 tracks, formed based on the patterns 606 and 608 of the layout 600, respectively, may function as terminals of yet another sub-capacitors, $C_3'$; and yet other M0 tracks, formed based on the patterns 608 and 610 of the layout 600, respectively, may function as terminals of yet another sub-capacitors, $C_4'$.

Similarly, the M2 tracks 532 and 534 can form one of a number of parallel connected sub-capacitors, $C_1'$, to further increase the capacitive value of the boost capacitor 304. The M2 tracks 532 and 534, formed based on the patterns 602 and 604 of the layout 600, respectively, may function as terminals of the sub-capacitors, $C_1'$. Further, other M2 tracks, formed based on the patterns 604 and 606 of the layout 600, respectively, may function as terminals of another sub-capacitors, $C_2'$; yet other M2 tracks, formed based on the patterns 606 and 608 of the layout 600, respectively, may function as terminals of yet another sub-capacitors, $C_3'$; and yet other M2 tracks, formed based on the patterns 608 and 610 of the layout 600, respectively, may function as terminals of yet another sub-capacitors, $C_4'$.

In accordance with various embodiments of the present disclosure, a thickness of the backside metal lines (e.g., BM0 tracks, BM2 tracks) is substantially greater than a thickness of the frontside metal lines (e.g., M0 tracks, M2 tracks). For example, with a certain technology node, the backside metal lines may have a thickness range of about 40 nanometers (nm) to about 400 nm, which is generally greater than a thickness range of the frontside meal lines. With such a greater thickness, a contact area of each sub-capacitor of the boost capacitor 304 can be proportionally increased. A capacitive value of each of the sub-capacitors can be increased accordingly (e.g., about 16% to about 25%), which can advantageously reduce discharge time of the boost capacitor 304. Consequently, the reference voltage 118 may be pulled to a negative voltage more quickly, which allows read operations of the SRAM device 100 to be finished more quickly and efficiently.

Figure 7:
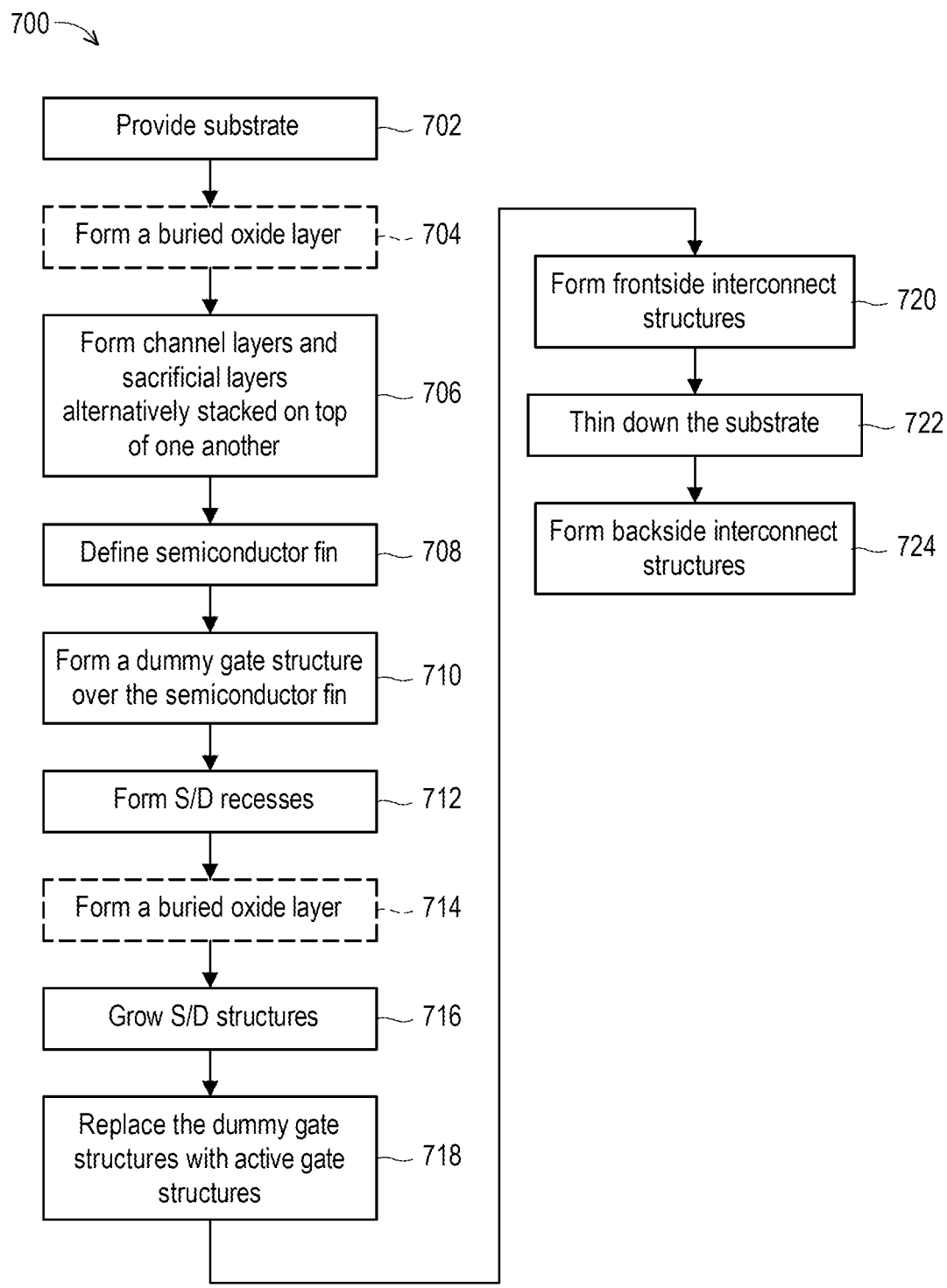
FIG. 7 is an example flow chart of a method for fabricating a semiconductor device (e.g., the memory device of FIG. 1), in accordance with some embodiments.

FIG. 7 depicts a flowchart of an example method 700 of forming or manufacturing a semiconductor device (e.g., at least a portion of the SRAM device 100), in accordance with some embodiments. It is understood that additional operations may be performed before, during, and/or after the method 700 depicted in FIG. 7. Operations of the method 700 may be associated with cross-sectional views of an example semiconductor device 800 at various fabrication stages as shown in FIGS. 9, 10, 11, 12, 13A, 13B, 14A, 14B, 15A, 15B, 16A, 16B, 17A, 17B, 18A, and 18B, respectively, which will be discussed in further detail below. In some embodiments, the method 700 is usable to form a semiconductor device, according to various layout designs as disclosed herein.

In brief overview, the method 700 starts with operation 702 of providing a substrate. Next, the method 700 can proceed to operation 704 of forming a buried oxide layer. Alternatively, the buried oxide layer may be formed later (see operation 714). Then, the method 700 proceeds to operation 706 of forming channel layers and sacrificial layers alternatively stacked on top of one another. The method 700 proceeds to operation 708 of defining a semiconductor fin. The method 700 proceeds to operation 710 of forming a dummy gate structure over the semiconductor fin. The method 700 proceeds to operation 712 of forming source and/or drain recesses. The method 700 can proceed to operation 714 of forming a buried oxide layer, if the buried oxide layer was not already formed in operation 704. The method 700 proceeds to operation 718 of replacing the dummy gate structures with respective active structures. The method 700 proceeds to operation 720 of forming frontside interconnect structures. The method 700 proceeds to operation 722 of thinning down the substrate until the bottom oxide layer is exposed. The method 700 proceeds to operation 724 of forming backside interconnect structures.

As mentioned above, FIGS. 8-18B illustrate cross-sectional views of an example semiconductor device 800 during various fabrication stages, made by method 700, in accordance with some embodiments. The semiconductor device 800 may be an implementation of the SRAM device 100, which includes a number of transistors (e.g., 306) and a number of boost capacitors (e.g., 304). Some of the transistors may be implemented in the GAA FET structure, in various embodiments. For example, FIGS. 8-11 are cross-sectional views of the semiconductor device 800 taken at various fabrication stages cut along the lengthwise (or longitudinal) direction of one or more dummy/active gate structures of the transistors, and FIGS. 12-18B are cross-sectional views of the semiconductor device 800 taken at various fabrication stages cut along the lengthwise (or longitudinal) direction of one or more channels of the transistors. Although FIGS. 8-18B illustrate the semiconductor device 800 including a GAA FET structure, it is understood that the semiconductor device 800 may include any of various other transistor structures and a number of other devices such as inductors, fuses, capacitors, coils, etc. which are not shown in FIGS. 8-18B for purposes of clarity of illustration.

For simplicity, FIGS. 8-12 and those with numbers ending in "A" from 13A to 18A illustrate the semiconductor device 800 at various fabrication stages where operation 704 of the method 700 is performed. If operation 704 is not performed, operation 714 is performed to form the buried oxide layer as shown in FIG. 13B. Accordingly, figures with numbers ending with "B" from 13B to 18B illustrate the semiconductor device 800 at various fabrication stages when operation 714 is performed.

Figure 8:
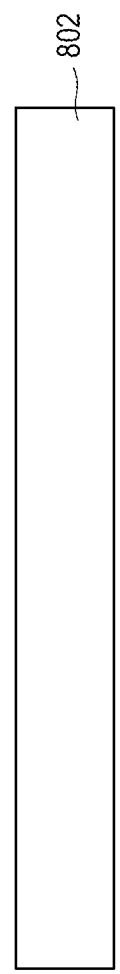
FIGS. 8, 9, 10, 11, 12, 13A, 13B, 14A, 14B, 15A, 15B, 16A, 16B, 17A, 17B, 18A, and 18B illustrate cross-sectional views of an example semiconductor device during various fabrication stages, made by the method of FIG. 7, in accordance with some embodiments.
Figure 8:

Corresponding to operation 702, FIG. 8 is a cross-sectional view of the semiconductor device 800 including a semiconductor substrate 802 at one of the various stages of fabrication. The cross-sectional view of FIG. 8 is cut in a direction along the lengthwise direction of one or more active/dummy gate structures of the semiconductor device 800.

The substrate 802 may be a semiconductor substrate, such as a bulk semiconductor, or the like, which may be doped (e.g., with a p-type or an n-type dopant) or undoped. The substrate 802 may be a wafer, such as a silicon wafer. Other substrates, such as a multi-layered or gradient substrate may also be used. In some embodiments, the semiconductor material of the substrate 802 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 9:
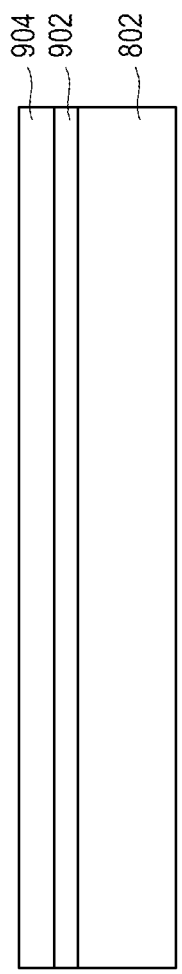
Figure 9:

Corresponding to operation 704, FIG. 9 is a cross-sectional view of the semiconductor device 800 including a buried oxide layer 902 at one of the various stages of fabrication. The cross-sectional view of FIG. 9 is cut in a direction along the lengthwise direction of one or more active/dummy gate structures of the semiconductor device 800. The semiconductor device 800 may further includes a layer of a semiconductor material 904 formed on the buried oxide layer 902. Such a combination of the substrate 802, the buried oxide layer 902, and the semiconductor material 904 may sometimes be collectively referred to as a semiconductor-on-insulator (SOI) substrate.

Figure 10:
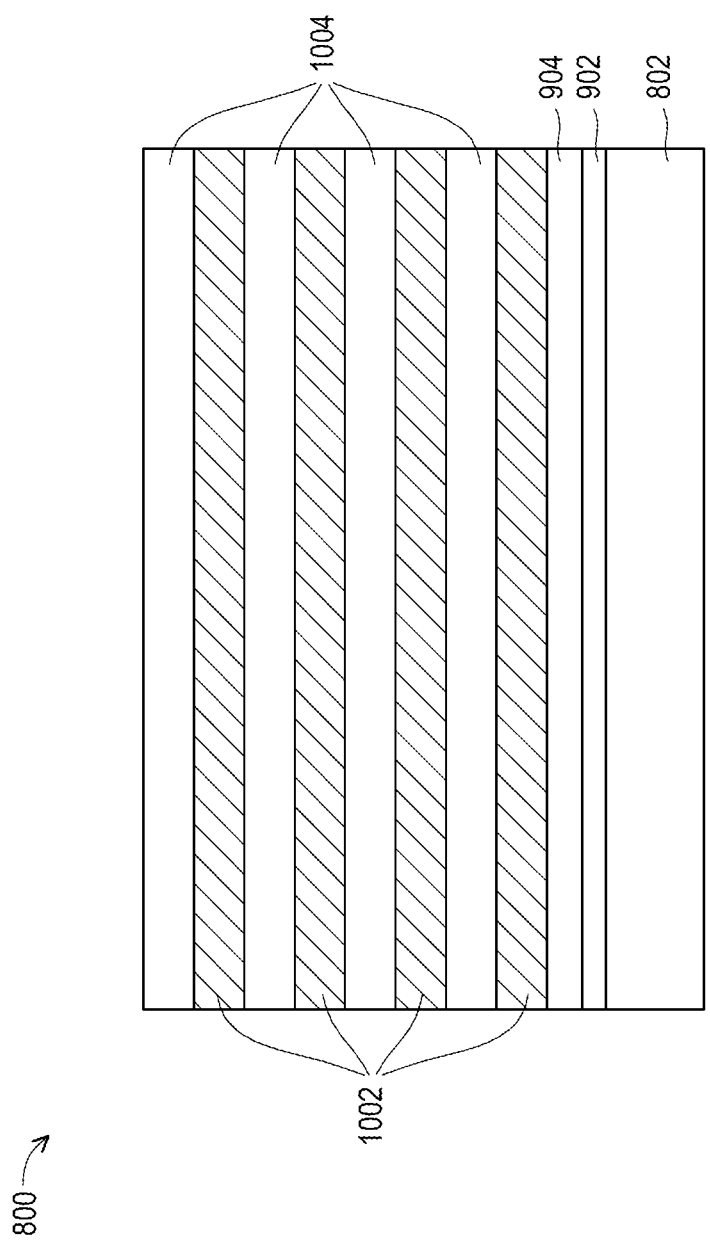

Corresponding to operation 706, FIG. 10 is a cross-sectional view of the semiconductor device 800 including a plurality of sacrificial layers 1002 and a plurality of channel layers 1004 at one of the various stages of fabrication. The cross-sectional view of FIG. 10 is cut in a direction along the lengthwise direction of one or more active/dummy gate structures of the semiconductor device 800.

A number of sacrificial layers 1002 and a number of channel layers 1004 are alternatingly disposed on top of one another to form a stack. For example, one of the channel layers 1004 is disposed over one of the sacrificial layers 1002, then another one of the sacrificial layers 1002 is disposed over the channel layer 1004, so on and so forth. The stack may include any number of alternately disposed sacrificial and channel layers 1002 and 1004. For example in the illustrated embodiments of FIG. 10 (and the following figures), the stack may include four sacrificial layers 1002, with four channel layers 1004 alternatingly disposed therebetween and with one of the channel layers 1004 being the topmost semiconductor layer. It should be understood that the semiconductor device 800 can include any number of sacrificial layers and any number of channel layers, with either one of them being the topmost layer, while remaining within the scope of the present disclosure.

The layers 1002 and 1004 may have respective different thicknesses. Further, the sacrificial layers 1002 may have different thicknesses from one layer to another layer. The channel layers 1004 may have different thicknesses from one layer to another layer. The thickness of each of the layers 1002 and 1004 may range from few nanometers to few tens of nanometers. The first layer of the stack may be thicker than other semiconductor layers 1002 and 1004. In an embodiment, each of the sacrificial layers 1002 has a thickness ranging from about 5 nanometers (nm) to about 20 nm, and each of the channel layers 1004 has a thickness ranging from about 5 nm to about 20 nm.

The two layers 1002 and 1004 may have different compositions. In various embodiments, the two layers 1002 and 1004 have compositions that provide for different oxidation rates and/or different etch selectivity between the layers. In an embodiment, the sacrificial layers 1002 may each include silicon germanium ($Si_{1-x}Ge_x$), and the channel layers may each include silicon (Si). In an embodiment, each of the channel layers 1004 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the channel layers 1004 (e.g., of silicon).

In various embodiments, the semiconductor layers 1004 may be intentionally doped. For example, when the semiconductor device 800 is configured as an n-type transistor (and operates in an enhancement mode), each of the channel layers 1004 may be silicon that is doped with a p-type dopant such as boron (B), aluminum (Al), indium (In), and gallium (Ga); and when the semiconductor device 800 is configured as a p-type transistor (and operates in an enhancement mode), each of the channel layers 1004 may be silicon that is doped with an n-type dopant such as phosphorus (P), arsenic (As), antimony (Sb). In another example, when the semiconductor device 800 is configured as an n-type transistor (and operates in a depletion mode), each of the channel layers 1004 may be silicon that is doped with an n-type dopant instead; and when the semiconductor device 800 is configured as a p-type transistor (and operates in a depletion mode), each of the channel layers 1004 may be silicon that is doped with a p-type dopant instead.

In some embodiments, each of the sacrificial layers 1002 is $Si_{1-x}Ge_x$ that includes less than 50% (x<0.5) Ge in molar ratio. For example, Ge may comprise about 15% to 35% of the sacrificial layers 1002 of $Si_{1-x}Ge_x$ in molar ratio. Furthermore, the sacrificial layers 1002 may include different compositions among them, and the channel layers 1004 may include different compositions among them. Either of the layers 1002 and 1004 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the layers 1002 and 1004 may be chosen based on providing differing oxidation rates and/or etch selectivity.

The layers 1002 and 1004 can be epitaxially grown from the semiconductor substrate 802. For example, each of the layers 1002 and 1004 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 802 extends upwardly, resulting in the layers 1002 and 1004 having the same crystal orientation with the semiconductor substrate 802.

Figure 11:
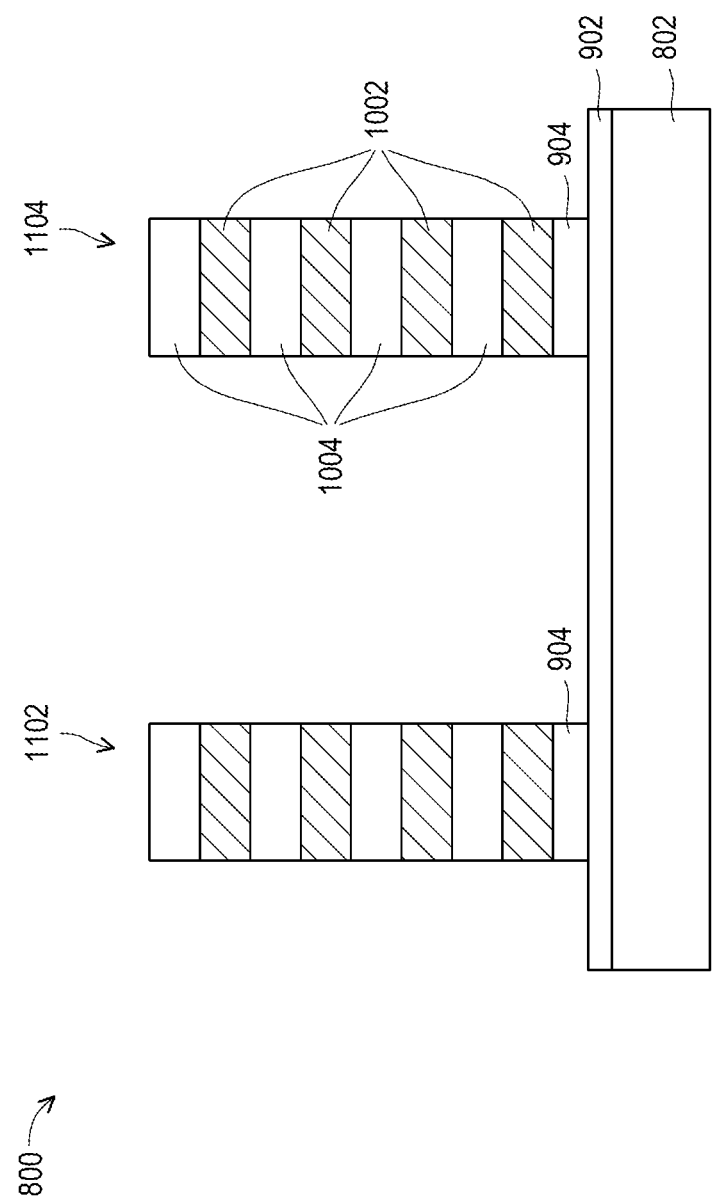

Corresponding to operation 708, FIG. 11 is a cross-sectional view of the semiconductor device 800 including a number of semiconductor fins, 1102 and 1104, at one of the various stages of fabrication. The cross-sectional view of FIG. 11 is cut in a direction along the lengthwise direction of one or more active/dummy gate structures of the semiconductor device 800.

Upon growing the layers 1002 and 1004 on the semiconductor substrate 802 (as a stack), the stack may be patterned to form the fin structures 1102 and 1104, as shown in FIG. 11. Each of the fin structures is elongated along a lateral direction and includes a stack of patterned sacrificial layers 1002 and channel layers 1004 interleaved with each other. The fin structures 1102 and 1104 are formed by patterning the stack of layers 1002 and 1004 and the semiconductor material 904 using, for example, photolithography and etching techniques.

For example, a mask layer (which can include multiple layers such as, for example, a pad oxide layer and an overlying hardmask layer) is formed over the topmost semiconductor layer of the stack (e.g., 1004 in FIG. 10). The pad oxide layer may be a thin film comprising silicon oxide formed, for example, using a thermal oxidation process. The pad oxide layer may act as an adhesion layer between the topmost channel layer 1004 and the hardmask layer. In some embodiments, the hardmask layer may include silicon nitride, silicon oxynitride, silicon carbonitride, the like, or combinations thereof. In some other embodiments, the hardmask layer may include a material similar as a material of the layers 1002/1004 such as, for example, $Si_{1-y}Ge_y$, Si, etc., in which the molar ratio (y) may be different from or similar to the molar ratio (x) of the sacrificial layers 1002. The hardmask layer may be formed over the stack (i.e., before pattering the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the layers 1002 and 1004 and the semiconductor material 904 to form the fin structures 1102 and 1104, thereby defining trenches (or openings) between adjacent fin structures. When multiple fin structures are formed, each of such trenches may be disposed between any adjacent ones of the fin structures. In some embodiments, the fin structures 1102 and 1104 are formed by etching the layers 1002-1004 and semiconductor material 904 in the trenches using, for example, reactive ion etching (RIE), neutral beam etching (NBE), the like, or combinations thereof. The etching may be anisotropic. In some embodiments, the trenches may be strips (when viewed from the top) parallel to each other, and closely spaced with respect to each other. In some embodiments, the trenches may be continuous and surround the respective fin structures.

Figure 12:
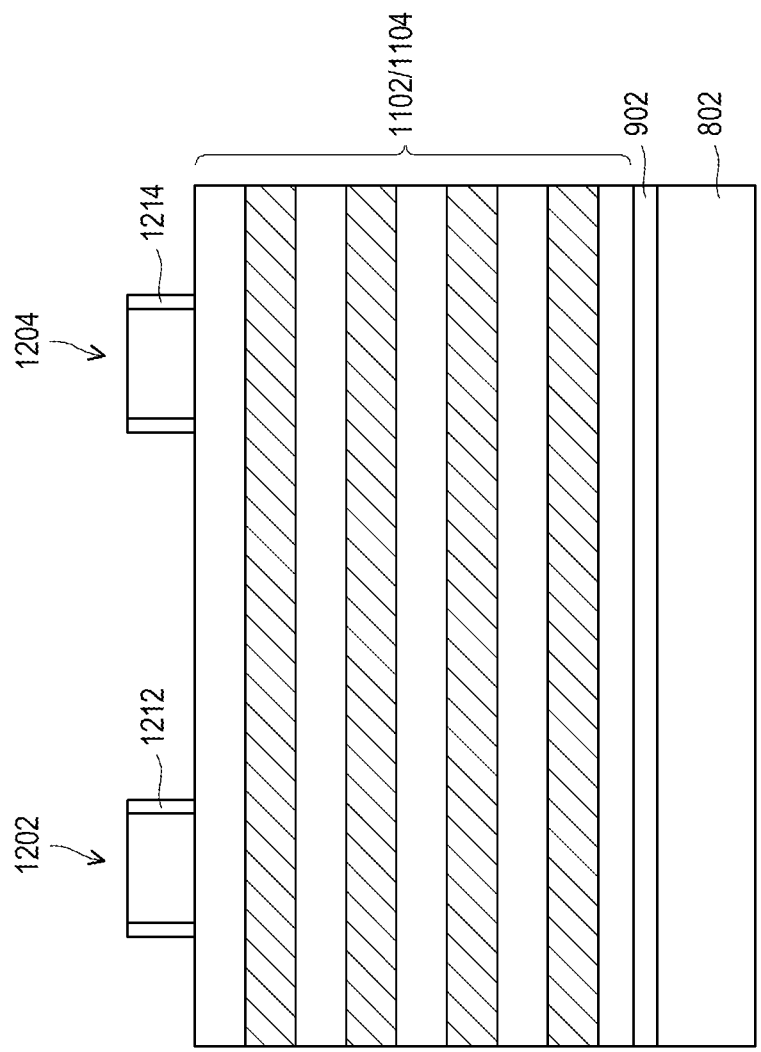

Corresponding to operation 710, FIG. 12 is a cross-sectional view of the semiconductor device 800 including a number of dummy gate structure, 1202 and 1204, at one of the various stages of fabrication. The cross-sectional view of FIG. 12 is cut in a direction along the lengthwise direction of one or more channels (formed by the fin structures) of the semiconductor device 800.

The dummy gate structures 1202 and 1204 are formed over each of the fin structures 1102 and 1104. The dummy gate structures 1202 and 1204, in parallel with each other, extend along a lateral direction perpendicular to the lengthwise direction of the fin structures 1102 and 1104. As such, each of the dummy gate structures 1202 and 1204 can straddle respective (e.g., central) portions of the fin structures 1102 and 1104. That is, a top surface and sidewalls of each of the fin structures 1102 and 1104, at least in part, are in contact with the dummy gate structures 1202 and 1204.

The dummy gate structures 1202 and 1204 may each include a dummy gate dielectric and a dummy gate, which are not shown separately for purpose of clarity. To form the dummy gate structure, a dielectric layer may be formed over the fin structure 1102 or 1104. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structure 1202/1204.

Upon forming the dummy gate structures 1202 and 1204, a gate spacer (e.g., 1202, 1204) may be formed on opposing sidewalls of a corresponding one of the dummy gate structures 1202 and 1204, as shown in FIG. 12. The gate spacer 1202/1204 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. The shapes and formation methods of the gate spacer 1202/1204, as illustrated in FIG. 12, are merely non-limiting examples, and other shapes and formation methods are possible. These and other variations are fully intended to be included within the scope of the present disclosure.

Figure 13A:
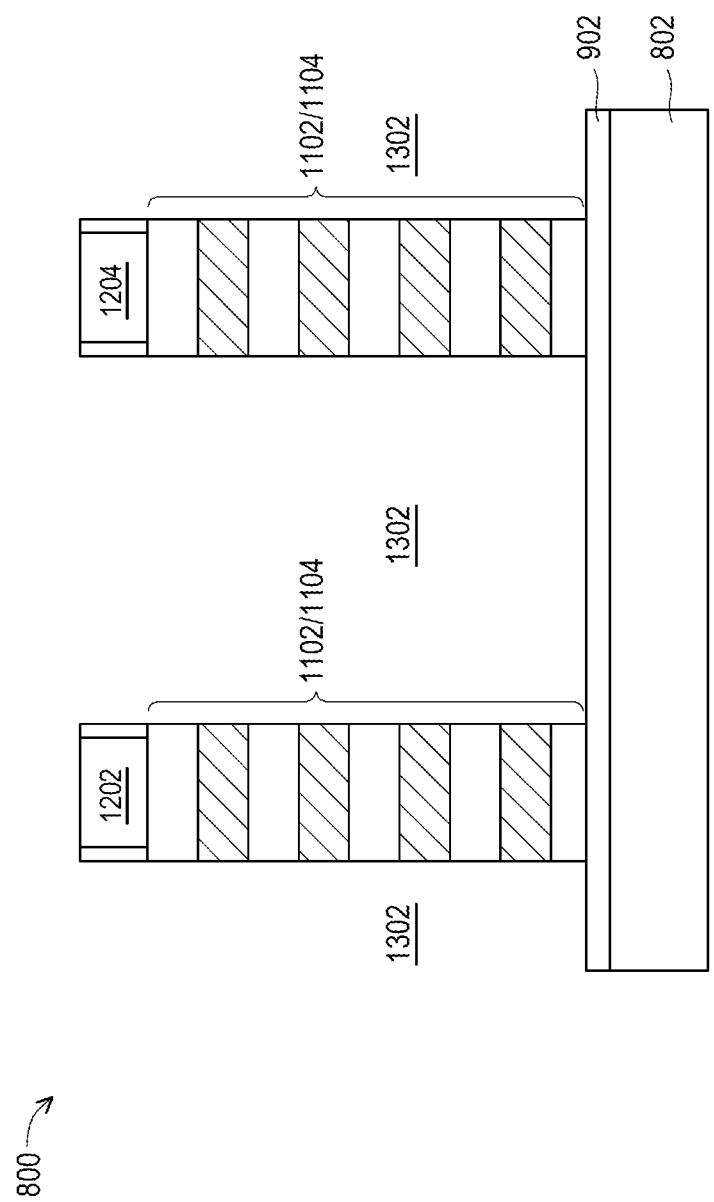
Figure 13B:
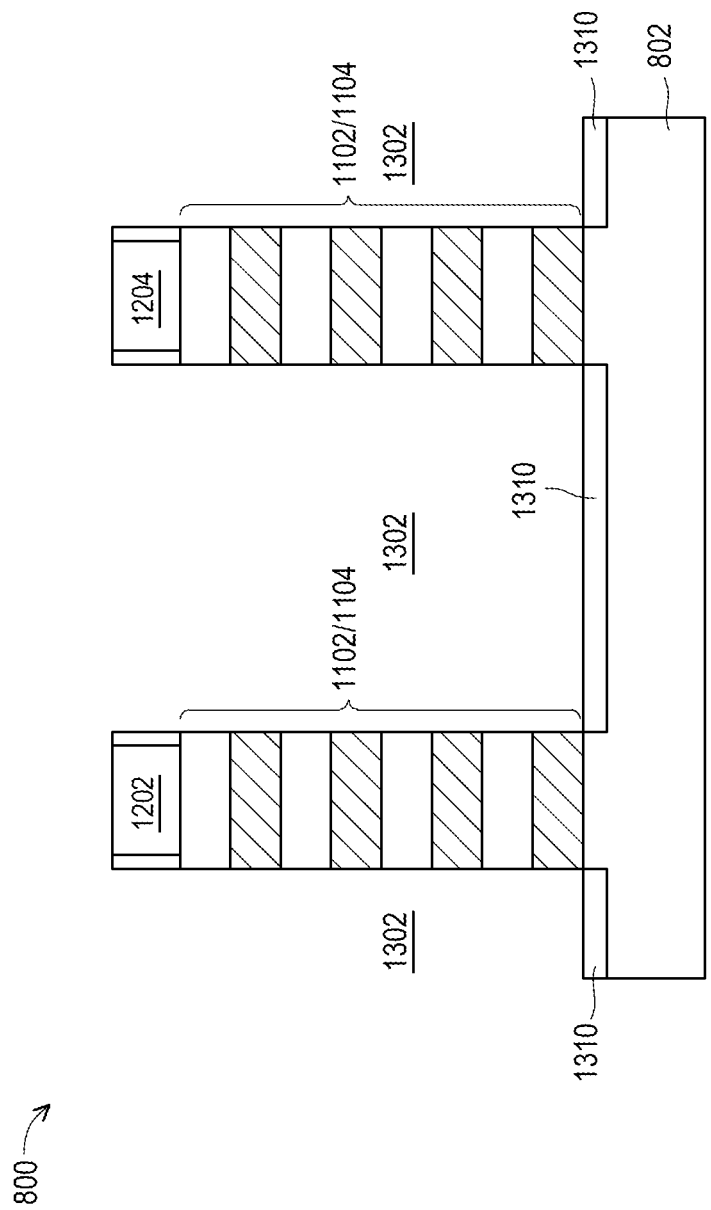

Corresponding to operation 712, FIG. 13A is a cross-sectional view of the semiconductor device 800 including a number of source/drain (S/D) recesses 1302 at one of the various stages of fabrication. The cross-sectional view of FIG. 13A is cut in a direction along the lengthwise direction of one or more channels (formed by the fin structures) of the semiconductor device 800.

The dummy gate structures 1202 and 1204 (together with their corresponding gate spacers) can serve as a mask to recess (e.g., etch) the non-overlaid portions of each of the fin structures 1102 and 1104, which results in the remaining fin structure 1102/1104 having respective remaining portions of the sacrificial layers 1002 and channel layers 1004 alternately stacked on top of one another. As a result, the S/D recesses 1302 can be formed on opposite sides of the remaining fin structure 1102/1104.

The recessing step to form the S/D recesses 1302 may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof to control the above-described etching rates.

Corresponding to operation 714 (which may be performed in the absence of performing operation 704), FIG. 13B is a cross-sectional view of the semiconductor device 800 in which a buried (or bottom) oxide layer 1310 is formed upon forming the S/D recesses 1302. The cross-sectional view of FIG. 13A is cut in a direction along the lengthwise direction of one or more channels (formed by the fin structures) of the semiconductor device 800. For example, after the S/D recesses 1302 are formed by etching the fin structures 1102 and 1104 that have no semiconductor material 904 and buried oxide layer 902 formed therebelow, portions of the substrate 802 (exposed by the S/D recesses 1302) may also be removed (e.g., etched). Such removed portions of the substrate 802 may be refilled with a dielectric material to form the buried oxide layer 1310.

Figure 14A:
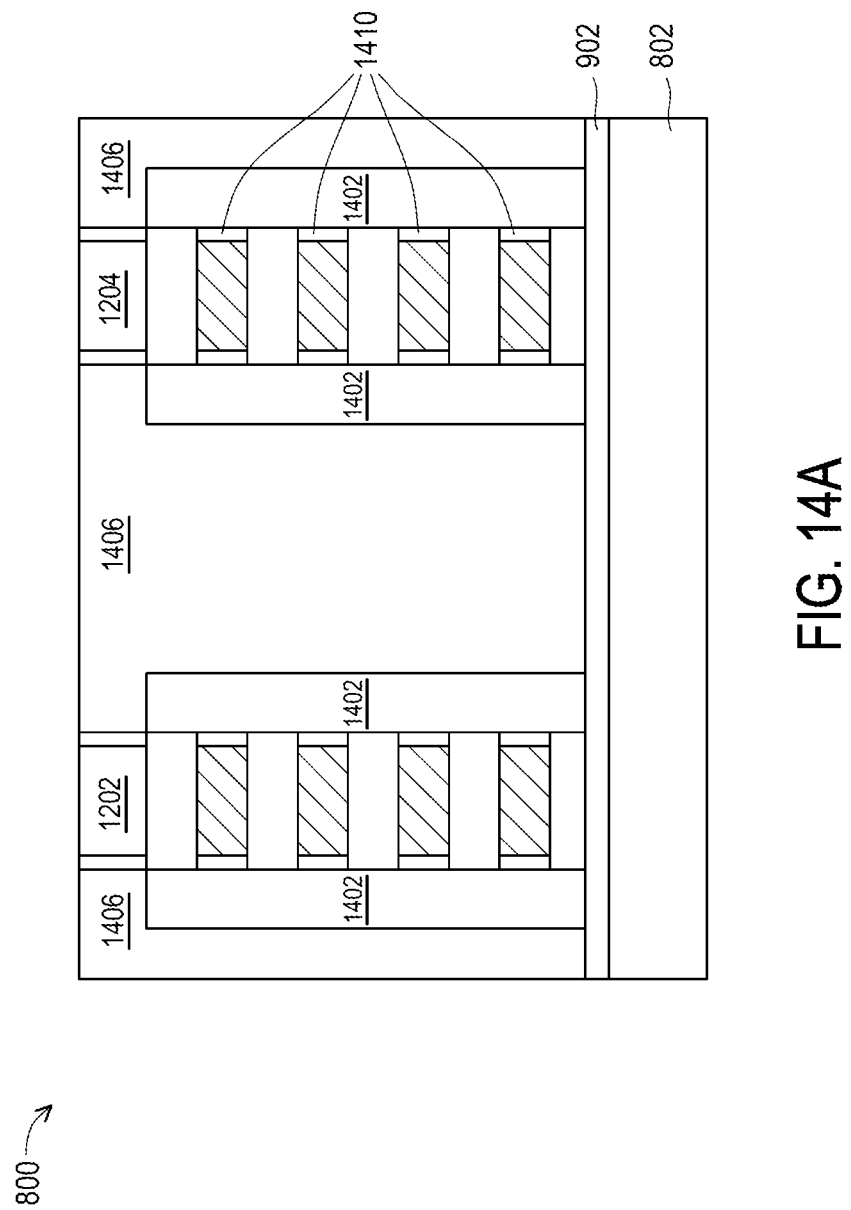
Figure 14B:
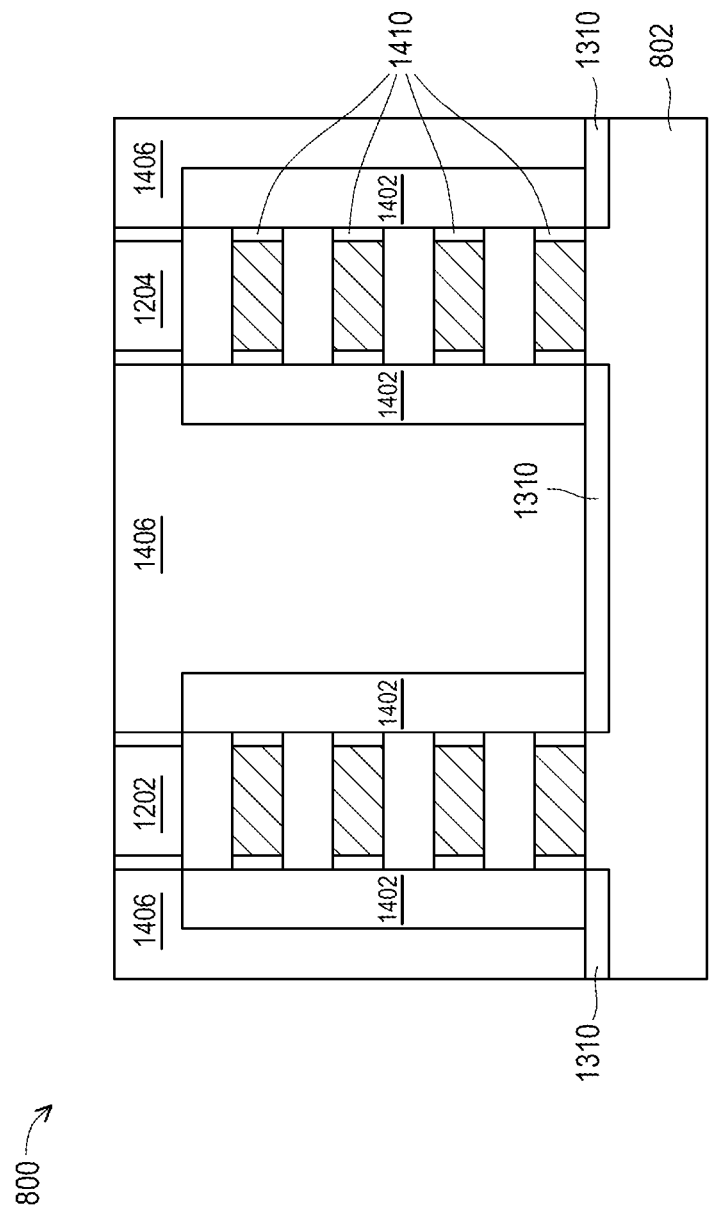

Corresponding to operation 716, FIG. 14A is a cross-sectional view of the semiconductor device 800 (with the buried oxide layer 902) that includes source/drain (S/D) structures 1402 and an interlayer dielectric (ILD) 1406, at one of the various stages of fabrication, and FIG. 14B is a cross-sectional view of the semiconductor device 800 (with the buried oxide layer 1310) that includes the S/D structures 1402 and the ILD 1406, at one of the various stages of fabrication. The cross-sectional views of FIGS. 14A-B are each cut in a direction along the lengthwise direction of one or more channels (formed by the fin structures) of the semiconductor device 800.

The S/D structures 1402 are disposed in the S/D recesses 1302 (FIGS. 13A-B). As such, (at least a lower portion of) the S/D structure 1402 can inherit the dimensions and profiles of the recesses 1302. The S/D structures 1402 are formed by epitaxially growing a semiconductor material (e.g., from the channel layers of the fin structure 1102/1104) in the recesses 1302 using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

Prior to forming the S/D structures 1402, end portions of the sacrificial layers 1002 can be removed (e.g., etched) using a "pull-back" process with a pull-back distance. In an example where the channel layers 1004 include Si, and the sacrificial layers 1002 include SiGe, the pull-back process may include a hydrogen chloride (HCl) gas isotropic etch process, which etches SiGe without attacking Si. As such, the Si layers (nanostructures) 1004 may remain substantially intact during this pull-back process. Consequently, a pair of recesses can be formed on the ends of each of the sacrificial layers 1002, with respect to the neighboring channel layers 1004. Next, such recesses on the ends of each sacrificial layer 1002 can be filled with a dielectric material to form inner spacers 1410, as shown in FIGS. 14A and 14B. The dielectric material for the inner spacers may include silicon nitride, boron carbonitride, silicon carbonitride, silicon carbon oxynitride, or any other type of dielectric material (e.g., a dielectric material having a dielectric constant k of less than about 5) appropriate to the role of forming an insulating gate sidewall spacer for transistors.

As further shown in FIGS. 14A and 14B, the S/D structures 1402 are disposed on the opposite sides of the fin structure 1102/1104 to couple to the channel layers 1004 therein and separate from the sacrificial layers 1002 of the fin structure 1102/1104 with the inner spacers 1410 disposed therebetween. According to various embodiments of the present disclosure, the channel layers 1004 in each of the fin structures 1102 and 1104 may collectively function as the conductive channel of a completed transistor. The sacrificial layers 1002 in each of the fin structures 1102 and 1104 may be later replaced with a portion of an active gate structure that is configured to wrap around the corresponding channel layers.

In some embodiments, the ILD 1406 can be concurrently formed to respectively overlay at least the S/D structures 1402. The ILD 1406 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD. The dielectric layer can function as a protection layer to prevent or reduces the loss of the ILD in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level top surface for the dielectric layer. After the planarization process, the top surface of the dielectric layer is level with the top surface of the dummy gate structures 1202 and 1204, in some embodiments.

Figure 15A:
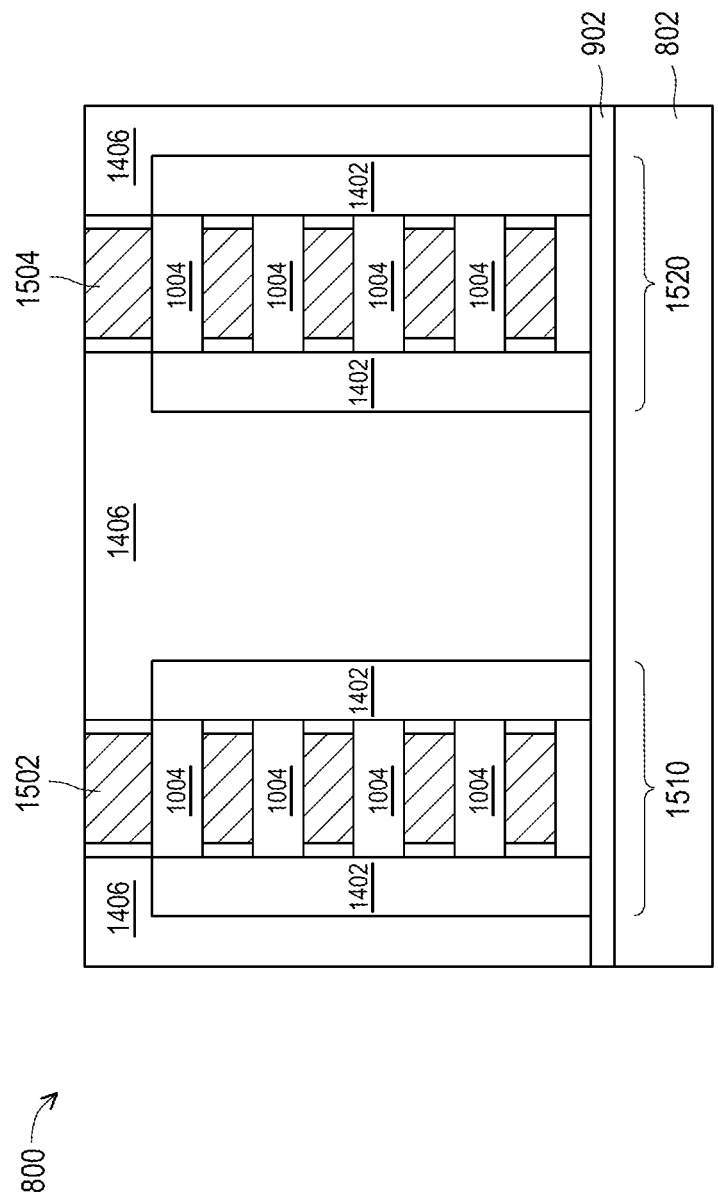
Figure 15B:
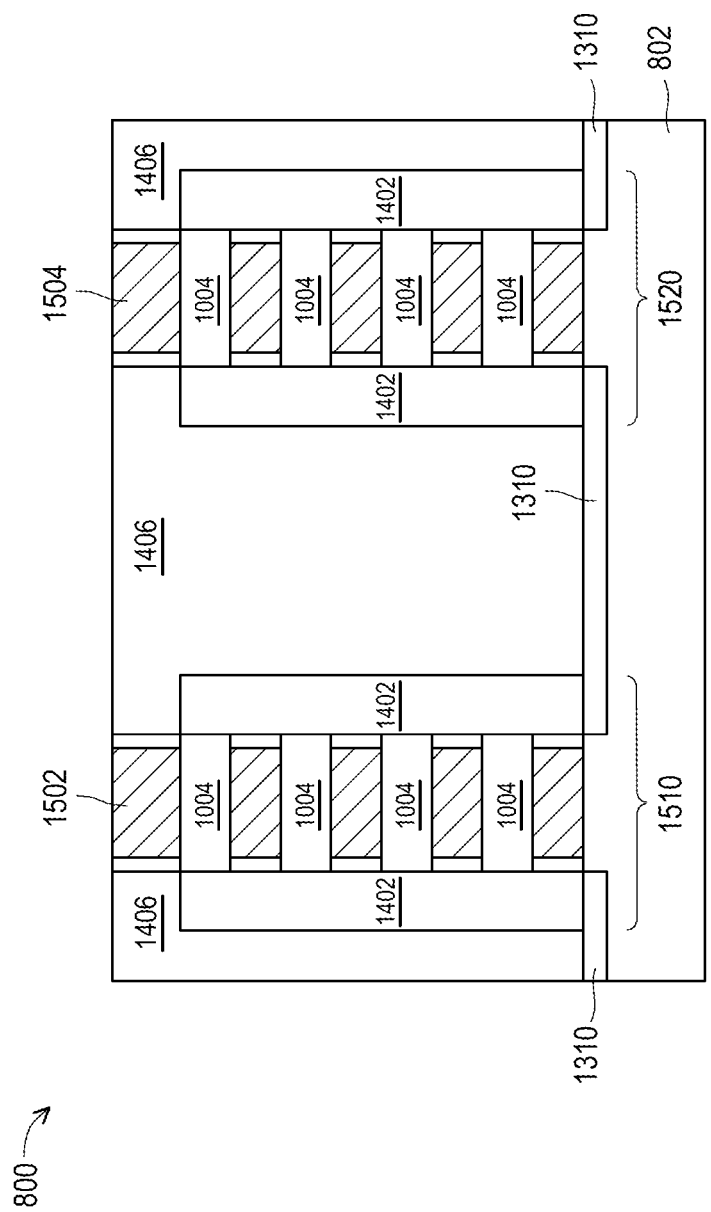

Corresponding to operation 718, FIG. 15A is a cross-sectional view of the semiconductor device 800 (with the buried oxide layer 902) that includes active metal gates, 1502 and 1504, at one of the various stages of fabrication, and FIG. 15B is a cross-sectional view of the semiconductor device 800 (with the buried oxide layer 1310) that includes the active metal gates 1502 and 1504, at one of the various stages of fabrication. The cross-sectional views of FIGS. 15A-B are each cut in a direction along the lengthwise direction of one or more channels (formed by the fin structures) of the semiconductor device 800.

Subsequently to forming the ILD 1406, the dummy gate structures 1202-1204, and the (remaining) sacrificial layers 1002 may be concurrently removed. In various embodiments, the dummy gate structures 1202-1204 and the sacrificial layers 1002 can be removed by applying a selective etch (e.g., a hydrochloric acid (HCl)), while leaving the channel layers 1004 substantially intact. After the removal of the dummy gate structures, a gate trench, exposing respective sidewalls of each of the channel layers 1004 may be formed. After the removal of the sacrificial layers 1002 (which can further extend the gate trench), respective bottom surface and/or top surface of each of the channel layers 1004 may be exposed. Consequently, a full circumference of each of the channel layers 1004 can be exposed. Next, the active gate structure 1502 and 1504 are formed to wrap around each of the channel layers 1004.

The active gate structures 1502-1504 each include a gate dielectric and a gate metal (which are not separately shown for the sake of clarity), in some embodiments. The gate dielectric can wrap around each of the channel layers 1004, e.g., the top and bottom surfaces and sidewalls. The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 1004.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Upon forming the active gate structures 1502-1504, a number of GAA FETs can be defined (or otherwise formed).

For example in FIGS. 15A-B, a first GAA FET 1510 and a second GAA FET 1520 are formed. The GAA FET 1510 has the active gate structure 1502 wrapping around the corresponding channel layers 1004 and the S/D structures 1402 disposed on the opposite sides of the active gate structure 1502 operatively serving as its gate (terminal) and source/drain (terminals), respectively. Similarly, the GAA FET 1520 has the active gate structure 1504 wrapping around the corresponding channel layers 1004 and the S/D structures 1402 disposed on the opposite sides of the active gate structure 1504 operatively serving as its gate (terminal) and source/drain (terminals), respectively. Such GAA FETs can respectively or collectively serve as one or more various components of the SRAM device 100, for example, the switch transistor 306, the transistors 220-270 of each memory cell 190, etc., in accordance with various embodiments.

Figure 16A:
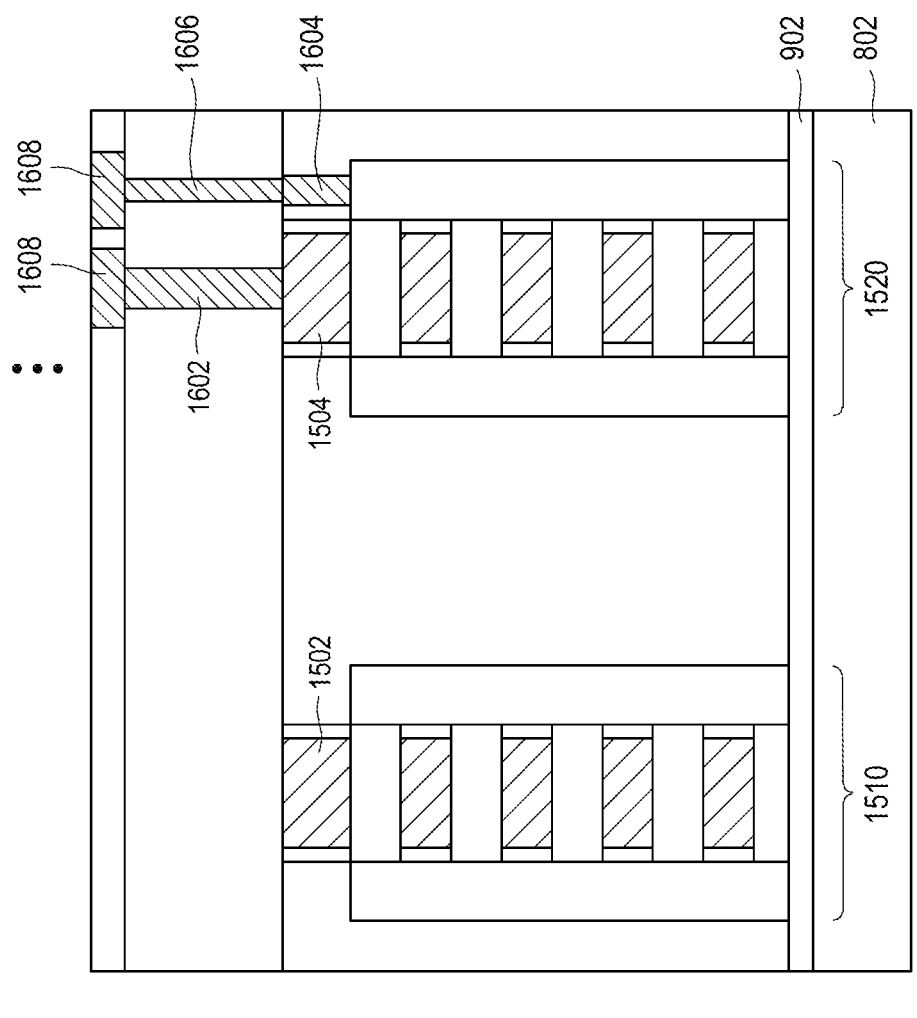
Figure 16B:
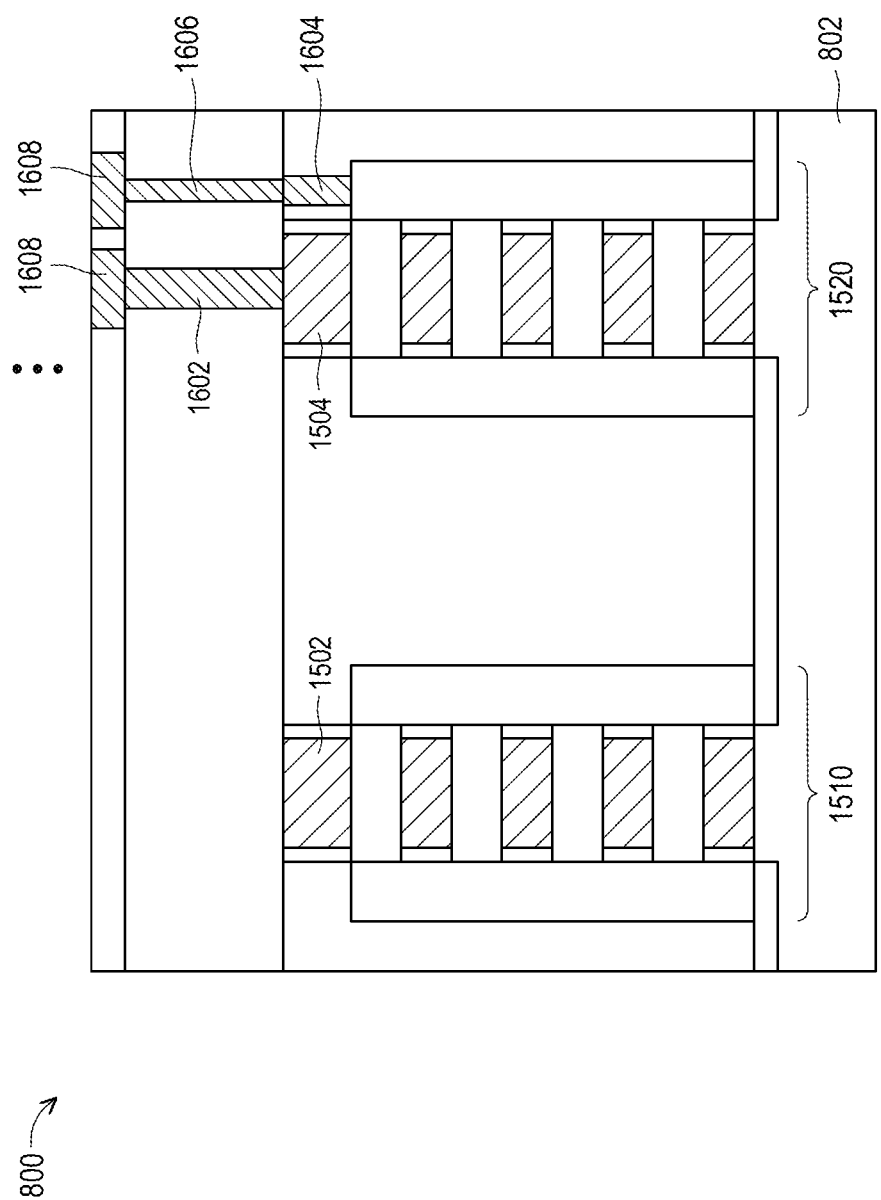

Corresponding to operation 720, FIG. 16A is a cross-sectional view of the semiconductor device 800 (with the buried oxide layer 902) that includes a number of frontside interconnect structures, 1602, 1604, 1606, and 1608, and FIG. 16B is a cross-sectional view of the semiconductor device (with the buried oxide layer 1310) that includes the frontside interconnect structures 1602 to 1608 at one of the various stages of fabrication. The cross-sectional views of FIGS. 16A-B are each cut in a direction along the lengthwise direction of one or more channels (formed by the fin structures) of the semiconductor device 800.

The frontside interconnect structures 1602 to 1608 (formed of one or more metal materials, e.g., copper) may be formed based on a single damascene process, a dual damascene process, a reactive ion etching process, and other suitable processes. For example, in a damascene process, one or more trenches/openings are formed in an ILD, and then refilled with one or more metal materials to form the frontside interconnect structures 1602 to 1608. Such an ILD is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

It should be appreciated that the frontside interconnect structures 1602 to 1608 are provided for illustration purposes, and thus, the semiconductor device 800 can have any number of each of the frontside interconnect structures 1602 to 1608, while remaining within the scope of the present disclosure. For example, the semiconductor device 800 can have any number of the frontside interconnect structure 1602 (which may be a VG connecting an active gate structure to one or more frontside metal tracks), any number of the frontside interconnect structure 1604 (which may be an MD coupling a S/D structure to one or more frontside metal tracks through a VD), any number of the frontside interconnect structure 1606 (which may be a VD coupling a S/D structure to one or more frontside metal tracks through an MD), and any number of the frontside interconnect structure 1608 (which may be an M0 track). Furthermore, the semiconductor device 800 can have any number of metal tracks disposed over the frontside interconnect structure 1608 (e.g., M1 tracks, M2 tracks, and so on).

In various embodiments, the frontside interconnect structures 1602 to 1608 can electrically connect a corresponding GAA FET to one or more other GAA FETs so as to collectively function as a desired circuit component of the SRAM device 100 (e.g., a memory cell, a logic gate, etc.). As such, these frontside interconnect structures 1602 to 1608 may each be configured to transmit or receive (or otherwise route) a signal.

In some other embodiments, some of these frontside interconnect structures (e.g., M0 tracks 1608) may function as a part of the boost capacitor 304 (e.g., $C_1'$, $C_2'$, $C_3'$, $C_4'$, etc.), as discussed above with respect to FIG. 5. For example, two adjacent ones of the metal tracks in one of the frontside metallization layers (e.g., M0 tracks 1608 shown in FIGS. 16A-B) can operatively serve as first and second terminals of one of the sub-capacitors of the boost capacitor 304, which cause an internal electric field (extending from one of the terminals to the other). A portion of the ILD interposed between such metal tracks can reduce the electric field and increase the corresponding capacitive value.

Figure 17A:
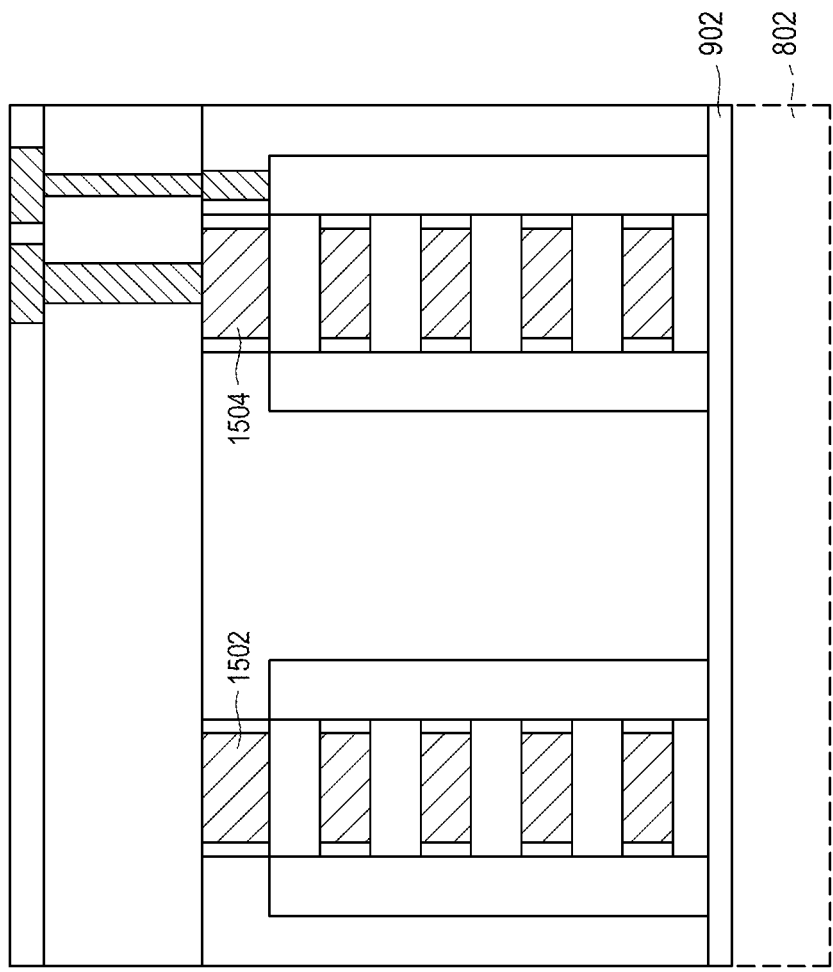
Figure 17B:
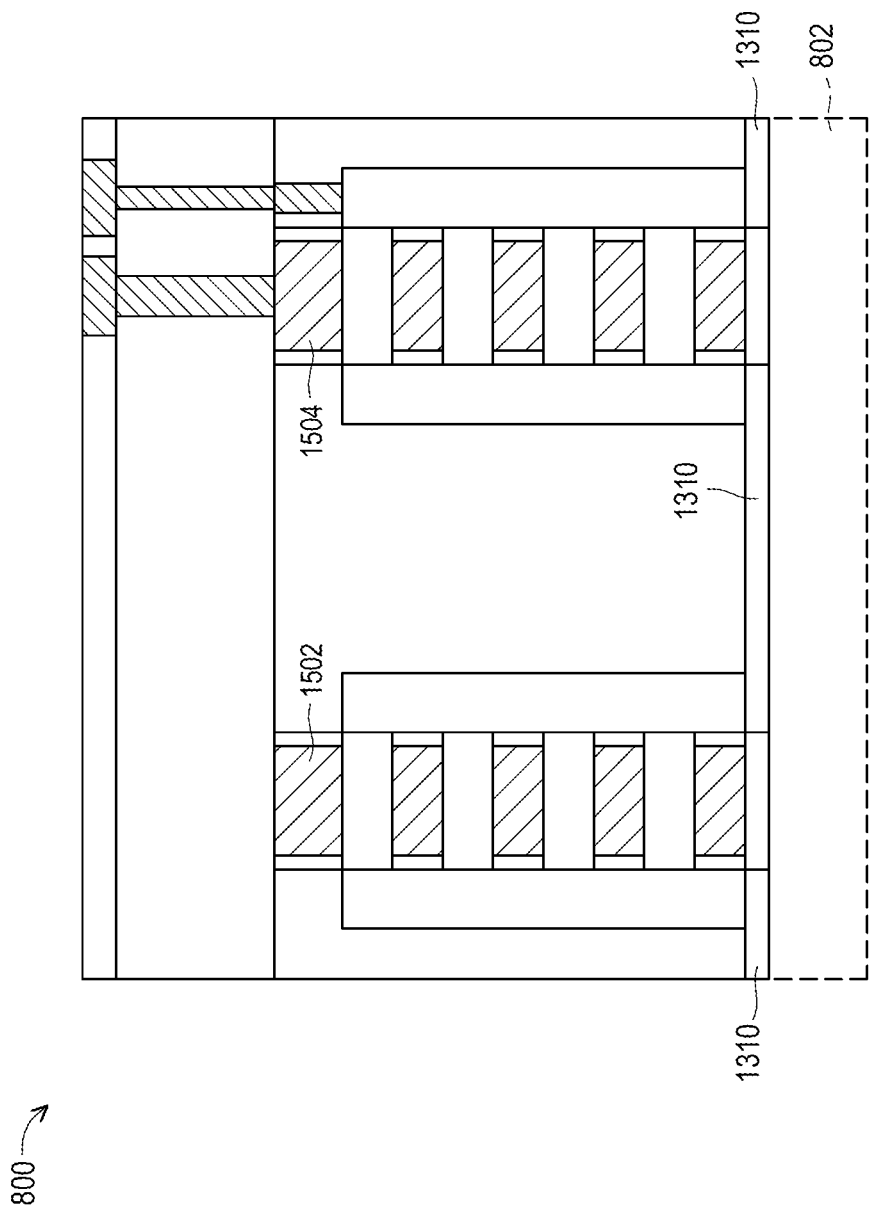

Corresponding to operation 722, FIGS. 17A and 17B are cross-sectional views of the semiconductor device 800, with the buried oxide layers 902 and 1310 respectively, in which the substrate 802 is thinned down from its backside at one of the various stages of fabrication. The cross-sectional views of FIGS. 17A-B are each cut in a direction along the lengthwise direction of one or more channels (formed by the fin structures) of the semiconductor device 800.

In the example of FIG. 17A, the substrate 802 (which is enclosed by dotted lines) is thinned down from its backside through a polishing process (e.g., a chemical-mechanical polishing (CMP) process). The CMP process may not be stopped until the buried oxide layer 902 is exposed. In the example of FIG. 17B, the substrate 802 (which is enclosed by dotted lines) is thinned down from its backside through a polishing process (e.g., a chemical-mechanical polishing (CMP) process). The CMP process may not be stopped until the buried oxide layer 1310 is exposed.

Figure 18A:
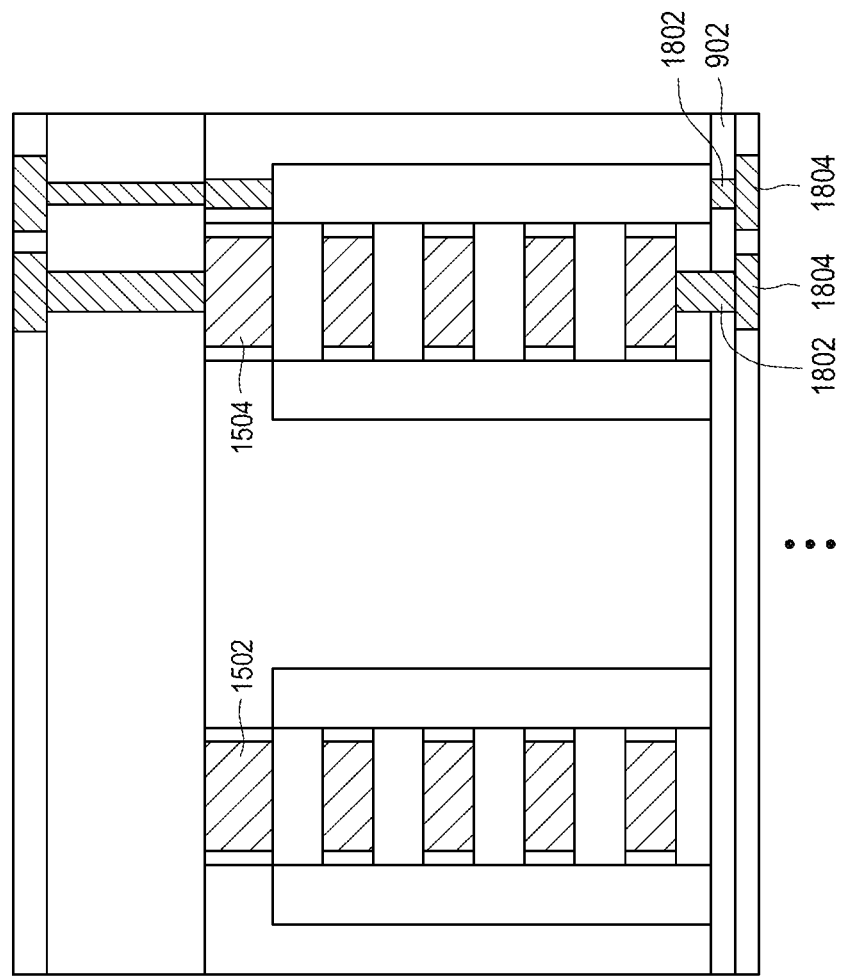
Figure 18B:
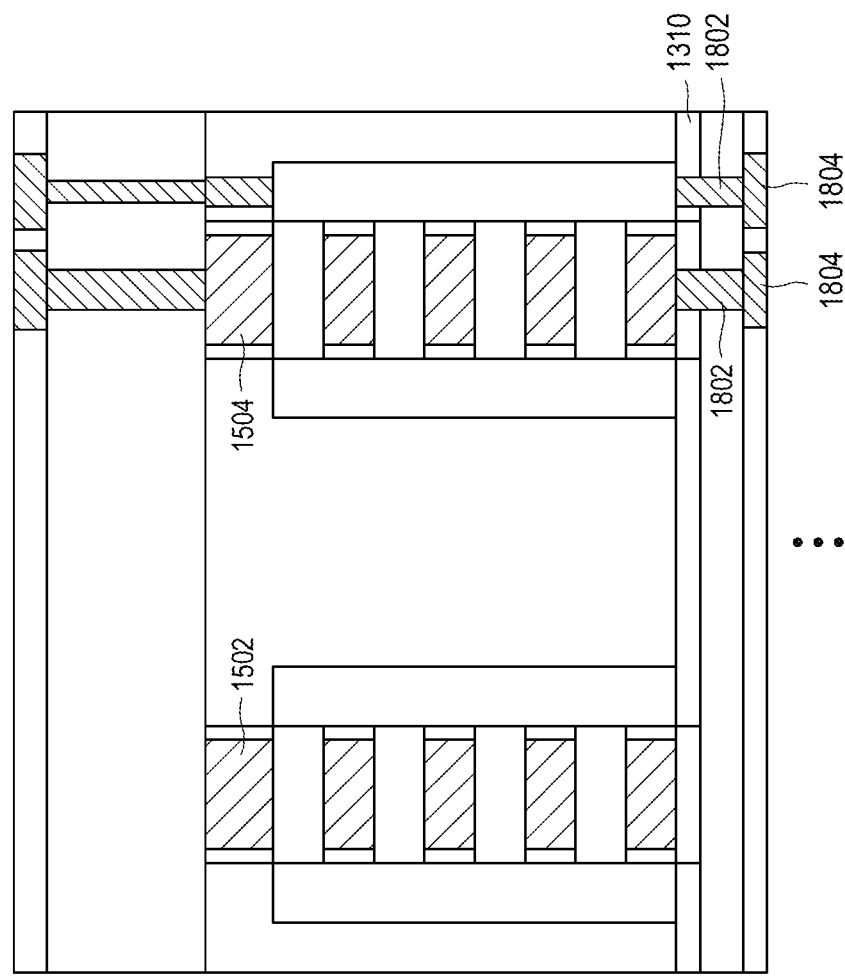

Corresponding to operation 724, FIG. 18A is a cross-sectional view of the semiconductor device 800 (with the buried oxide layer 902) that includes a number of backside interconnect structures, 1802 and 1804, and FIG. 18B is a cross-sectional view of the semiconductor device (with the buried oxide layer 1310) that includes the backside interconnect structures 1802 to 1804 at one of the various stages of fabrication. The cross-sectional views of FIGS. 18A-B are each cut in a direction along the lengthwise direction of one or more channels (formed by the fin structures) of the semiconductor device 800.

The backside interconnect structures 1802 to 1804 (formed of one or more metal materials, e.g., copper) may be formed based on a single damascene process, a dual damascene process, a reactive ion etching process, and other suitable processes. For example, in a damascene process, one or more trenches/openings are formed in an ILD, and then refilled with one or more metal materials to form the backside interconnect structures 1802 to 1804. Such an ILD is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

It should be appreciated that the backside interconnect structures 1802 to 1804 are provided for illustration purposes, and thus, the semiconductor device 800 can have any number of each of the backside interconnect structures 1802 to 1804, while remaining within the scope of the present disclosure. For example, the semiconductor device 800 can have any number of the backside interconnect structure 1802 (which may be a BV connecting an active gate structure or S/D structure to one or more backside metal tracks), and any number of the backside interconnect structure 1804 (which may be an BM0 track). Furthermore, the semiconductor device 800 can have any number of metal tracks disposed over the backside interconnect structure 1804 (e.g., BM1 tracks, BM2 tracks, and so on).

In various embodiments, some of these backside interconnect structures (e.g., BM0 tracks 1804) may function as a part of the boost capacitor 304 (e.g., $C_1$, $C_2$, $C_3$, $C_4$, etc.), as discussed above with respect to FIG. 5. For example, two adjacent ones of the metal tracks in one of the backside metallization layers (e.g., BM0 tracks 1804 shown in FIGS. 18A-B) can operatively serve as first and second terminals of one of the sub-capacitors of the boost capacitor 304, which cause an internal electric field (extending from one of the terminals to the other). A portion of the ILD interposed between such metal tracks can reduce the electric field and increase the corresponding capacitive value.

In one aspect of the present disclosure, a memory device is disclosed. The memory device includes a memory cell; a bit line coupled to the memory cell; and a voltage generator coupled to the bit line and configured to provide a negative voltage to the bit line. The voltage generator includes a transistor; and a first capacitor having a first terminal and a second terminal electrically coupled to a drain and a gate of the transistor, respectively. The drain and the gate of the transistor are formed on a first side of a substrate, and the first and second terminals of the first capacitor are formed on a second side of the substrate opposite to the first side.

In another aspect of the present disclosure, a memory device is disclosed. The memory device includes a memory array formed on a front side of a substrate. The memory array is accessible through a plurality of bit lines. The memory device includes a switch transistor formed on the front side of the substrate. The switch transistor is operatively coupled to the plurality of bit lines. The memory device includes a first capacitor formed on a back side of the substrate. The first capacitor is configured to reduce a voltage level present on at least one of the plurality of bit lines, in response to the switch transistor being turned off.

In yet another aspect of the present disclosure, a method for fabricating memory devices is disclosed. The method includes forming, on a front side of a substrate, a plurality of memory transistors configured as a memory array. The method includes forming, on the front side of the substrate, a plurality of bit lines operatively coupled to the memory array. The method includes forming, on the front side of the substrate, a switch transistor operatively coupled to the plurality of bit lines. The method includes forming, on a back side of the substrate, a first capacitor configured to reduce a voltage level present on at least one of the plurality of bit lines to a negative value.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory cell;
   a bit line coupled to the memory cell; and
   a voltage generator coupled to the bit line and configured to provide a negative voltage to the bit line;
   wherein the voltage generator comprises:
      a transistor; and
      a first capacitor having a first terminal and a second terminal electrically coupled to a drain and a gate of the transistor, respectively; and
   wherein the drain and the gate of the transistor are formed on a first side of a substrate, and the first and second terminals of the first capacitor are formed on a second side of the substrate opposite to the first side, wherein the voltage generator comprises a second capacitor having a first terminal and a second terminal electrically coupled to the drain and the gate of the transistor, respectively, wherein the first and second terminals of the second capacitor are formed on the first side of the substrate, and where a capacitance of the first capacitor on the second side of the substrate is greater than a capacitance of the second capacitor on the first side of the substrate.

2. The memory device of claim 1, wherein the memory cell includes a plurality of memory transistors and the bit line includes a first metal line, and wherein the plurality of memory transistors and the first metal line are formed on the first side of the substrate.

3. The memory device of claim 1, wherein the first and second terminals of the first capacitor include a first metal line and a second metal line, respectively, and wherein the first and second metal line are arranged in parallel with each other.

4. The memory device of claim 3, wherein the first and second metal lines each have a thickness in a range of about 40 nanometers (nm) to about 400 nm.

5. The memory device of claim 3, wherein the first metal line and second metal line are disposed in a common one of a plurality of metallization layers formed on the second side of the substrate.

6. The memory device of claim 5, wherein the common metallization layer is closer to the substrate than any other metallization layer.

7. The memory device of claim 5, wherein the common metallization layer is spaced from the substrate with two of the plurality of metallization layers.

8. The memory device of claim 1, wherein the voltage generator comprises:
   a second capacitor having a first terminal and a second terminal electrically coupled to the drain and the gate of the transistor, respectively, wherein the first and second terminals of the second capacitor are formed on the second side of the substrate;
   a third capacitor having a first terminal and a second terminal electrically coupled to the drain and the gate of the transistor, respectively, wherein the first and second terminals of the third capacitor are formed on the second side of the substrate; and
   a fourth capacitor having a first terminal and a second terminal electrically coupled to the drain and the gate of the transistor, respectively, wherein the first and second terminals of the fourth capacitor are formed on the second side of the substrate.

9. The memory device of claim 8, wherein the second terminal of the first capacitor and the first terminal of the second capacitor share a first common metal line, the second terminal of the second capacitor and the second terminal of the third capacitor share a second common metal line, and the first terminal of the third capacitor and the first terminal of the fourth capacitor share a third common metal line, and wherein the negative voltage is present on the drain of the transistor in response to the transistor being turned off.

10. The memory device of claim 1, wherein the first and second terminals of the first capacitor include a first metal line and a second metal line, respectively, and the first and second terminals of the second capacitor include a third metal line and a fourth metal line, respectively, and wherein the first and second metal lines each have a first thickness and the third and fourth metal lines each have a second thickness substantially thinner than the first thickness.

11. A memory device, comprising:
a memory array formed on a front side of a substrate, wherein the memory array is accessible through a plurality of bit lines;
a switch transistor formed on the front side of the substrate, wherein the switch transistor is operatively coupled to the plurality of bit lines; and
a first capacitor formed on a back side of the substrate, wherein the first capacitor is configured to reduce a voltage level present on at least one of the plurality of bit lines, in response to the switch transistor being turned off, and wherein a first terminal and a second terminal of the first capacitor are electrically coupled to a drain and a gate of the transistor, respectively; and
a second capacitor formed on the front side of the substrate, wherein the second capacitor is electrically coupled to the first capacitor in parallel, wherein a capacitance of the first capacitor on the back side of the substrate is greater than a capacitance of the second capacitor on the front side of the substrate.

12. The memory device of claim 11, wherein the thickness of each of the first and second metal lines is greater than about 50 nanometers (nm).

13. The memory device of claim 11, wherein the first metal line and second metal line are disposed in a common one of a plurality of metallization layers formed on a second side of the substrate.

14. The memory device of claim 11, wherein a first terminal and a second terminal of the first capacitor include a first metal line and a second metal line, respectively, and wherein the first and second metal line are arranged in parallel with each other.

15. The memory device of claim 14, wherein the first and second metal lines each have a thickness equal to or greater than about 40 nanometers (nm).

16. The memory device of claim 11, wherein a first terminal and a second terminal of the first capacitor are coupled to a drain and a gate of the switch transistor, respectively.

17. The memory device of claim 11, wherein the voltage level is configured to be reduced below 0 volts.

18. A method for fabricating memory devices, comprising:
forming, on a front side of a substrate, a plurality of memory transistors configured as a memory array;
forming, on the front side of the substrate, a switch transistor;
forming, on the front side of the substrate, a plurality of bit lines operatively coupled to the memory array, wherein the switch transistor is operatively coupled to the plurality of bit lines;
forming, on a back side of the substrate, a first capacitor configured to reduce a voltage level present on at least one of the plurality of bit lines to a negative value, wherein a first terminal and a second terminal of the first capacitor are electrically coupled to a drain and a gate of the switch transistor, respectively; and
forming, on the front side of the substrate, a second capacitor electrically coupled to the first capacitor in parallel, wherein a capacitance of the first capacitor on the back side of the substrate is greater than a capacitance of the second capacitor on the front side of the substrate.

19. The method of claim 18, wherein the first and second terminals each have a thickness in a range of about 40 nanometers (nm) to about 400 nm.

20. The method of claim 18, wherein the voltage level is configured to be reduced below 0 volts.

* * * * *